(12) United States Patent
Sakakibara et al.

(10) Patent No.: US 10,074,661 B2
(45) Date of Patent: Sep. 11, 2018

(54) THREE-DIMENSIONAL JUNCTION MEMORY DEVICE AND METHOD READING THEREOF USING HOLE CURRENT DETECTION

(71) Applicant: SANDISK TECHNOLOGIES LLC, Plano, TX (US)

(72) Inventors: Kiyohiko Sakakibara, Yokkaichi (JP); Yusuke Ikawa, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/284,067

(22) Filed: Oct. 3, 2016

(65) Prior Publication Data

US 2017/0025421 A1 Jan. 26, 2017

Related U.S. Application Data

(63) Continuation-in-part of application No. 14/707,459, filed on May 8, 2015, now Pat. No. 9,666,281.

(51) Int. Cl.
*H01L 21/28* (2006.01)
*H01L 27/115* (2017.01)
(Continued)

(52) U.S. Cl.
CPC ........ *H01L 27/115* (2013.01); *G11C 16/0483* (2013.01); *H01L 21/28273* (2013.01);
(Continued)

(58) Field of Classification Search
CPC ............... H01L 21/28; H01L 21/28273; H01L 21/28282; H01L 27/115; H01L 27/11556;
(Continued)

(56) References Cited

U.S. PATENT DOCUMENTS 5,915,167 A 6/1999 Leedy
7,005,350 B2 2/2006 Walker et al.
(Continued)

FOREIGN PATENT DOCUMENTS

JP 2013093577 A 5/2013
KR 20100109745 A 10/2010
(Continued)

OTHER PUBLICATIONS

Invitation to Pay Additional Search Fees issued in PCT Application No. PCT/US13/41410, dated Sep. 9, 2013.(6 pp.).
(Continued)

*Primary Examiner* — Fazli Erdem
(74) *Attorney, Agent, or Firm* — The Marbury Law Group PLLC

(57) ABSTRACT

Data stored in a plurality of charge storage elements in a three-dimensional memory device can be read with high speed by measuring a majority charge carrier current passing through a vertical semiconductor channel. A memory film is provided in a memory opening extending through an alternating stack of insulating layers and electrically conductive layers. A set of doped semiconductor material regions having a doping of a first conductivity type can collectively extend continuously from underneath a top surface of a substrate through the memory film to a level of a topmost layer of the alternating stack. A well contact via structure can contact a doped contact region, which is an element of the set of doped semiconductor material regions. A p-n junction is provided within each memory opening between the doped vertical semiconductor channel and an upper doped semiconductor region having a doping of a second conductivity type.

21 Claims, 26 Drawing Sheets

(51) Int. Cl.
*H01L 29/423* (2006.01)
*H01L 29/04* (2006.01)
*H01L 29/08* (2006.01)
*H01L 29/10* (2006.01)
*H01L 29/06* (2006.01)
*G11C 16/04* (2006.01)
*H01L 27/11556* (2017.01)
*H01L 27/11582* (2017.01)
*H01L 27/1157* (2017.01)
*H01L 27/11524* (2017.01)
*H01L 29/739* (2006.01)
*H01L 29/868* (2006.01)

(52) U.S. Cl.
CPC .... *H01L 21/28282* (2013.01); *H01L 27/1157* (2013.01); *H01L 27/11556* (2013.01); *H01L 27/11582* (2013.01); *H01L 29/04* (2013.01); *H01L 29/0688* (2013.01); *H01L 29/0847* (2013.01); *H01L 29/1037* (2013.01); *H01L 29/42328* (2013.01); *H01L 29/42344* (2013.01); *H01L 27/11524* (2013.01); *H01L 29/7391* (2013.01); *H01L 29/868* (2013.01)

(58) Field of Classification Search
CPC ........... H01L 27/1157; H01L 27/11582; H01L 29/423; H01L 29/04; H01L 29/0688; H01L 29/0847; H01L 29/1037; H01L 29/42328; H01L 29/42344
See application file for complete search history.

(56) References Cited

U.S. PATENT DOCUMENTS

| | | | |
|---|---|---|---|
| 7,023,739 B2 | 4/2006 | Chen et al. | |
| 7,129,538 B2 | 10/2006 | Lee et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,745,265 B2 | 6/2010 | Mokhlesi et al. | |
| 7,764,534 B2 | 7/2010 | Thorp et al. | |
| 7,808,038 B2 | 10/2010 | Mokhlesi et al. | |
| 7,825,455 B2 | 11/2010 | Lee et al. | |
| 7,846,782 B2 | 12/2010 | Maxwell et al. | |
| 7,848,145 B2* | 12/2010 | Mokhlesi | H01L 27/11568 365/185.05 |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,081,515 B2* | 12/2011 | Satoh | H01L 27/11565 257/324 |
| 8,187,932 B2 | 5/2012 | Nguyen et al. | |
| 8,394,716 B2 | 3/2013 | Hwang et al. | |
| 8,520,425 B2 | 8/2013 | Xiao et al. | |
| 9,230,905 B2 | 1/2016 | Takaki et al. | |
| 9,230,985 B1* | 1/2016 | Wu | H01L 27/11582 |
| 9,331,088 B2 | 5/2016 | Takaki | |
| 9,343,507 B2 | 5/2016 | Takaki | |
| 9,449,924 B2 | 9/2016 | Takaki | |
| 2002/0028541 A1* | 3/2002 | Lee | G11C 16/3427 438/149 |
| 2003/0062574 A1 | 4/2003 | Hsieh | |
| 2006/0113612 A1* | 6/2006 | Gopalakrishnan | H01L 27/105 257/392 |
| 2007/0114509 A1* | 5/2007 | Herner | G11C 13/0007 257/4 |
| 2007/0210338 A1 | 9/2007 | Orlowski | |
| 2007/0228414 A1* | 10/2007 | Kumar | H01L 21/84 257/183 |
| 2007/0252201 A1 | 11/2007 | Kito et al. | |
| 2009/0003082 A1 | 1/2009 | Meeks et al. | |
| 2009/0179262 A1* | 7/2009 | Holz | H01L 27/108 257/331 |
| 2009/0230449 A1 | 9/2009 | Sakaguchi et al. | |
| 2009/0310425 A1* | 12/2009 | Sim | H01L 27/11526 365/185.29 |
| 2010/0013049 A1 | 1/2010 | Tanaka et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0181610 A1 | 7/2010 | Kim et al. | |
| 2010/0207195 A1 | 8/2010 | Fukuzumi et al. | |
| 2010/0254191 A1 | 10/2010 | Son et al. | |
| 2010/0314678 A1* | 12/2010 | Lim | H01L 27/11578 257/324 |
| 2010/0320528 A1 | 12/2010 | Jeong et al. | |
| 2011/0031546 A1 | 2/2011 | Uenaka et al. | |
| 2011/0076819 A1 | 3/2011 | Kim et al. | |
| 2011/0090737 A1* | 4/2011 | Yoo | G11C 16/0483 365/185.11 |
| 2011/0133606 A1 | 6/2011 | Yoshida et al. | |
| 2011/0169071 A1 | 7/2011 | Uenaka | |
| 2011/0266606 A1 | 11/2011 | Park et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0147648 A1 | 6/2012 | Scheuerlein | |
| 2012/0161229 A1* | 6/2012 | Kwon | H01L 27/108 257/331 |
| 2013/0100741 A1* | 4/2013 | Choi | H01L 27/11565 365/185.18 |
| 2013/0107602 A1* | 5/2013 | Oh | H01L 27/11556 365/51 |
| 2013/0264631 A1 | 10/2013 | Alsmeier et al. | |
| 2013/0285138 A1* | 10/2013 | Vega | H01L 29/7391 257/330 |
| 2013/0292630 A1* | 11/2013 | Sasago | H01L 27/2454 257/4 |
| 2013/0313627 A1 | 11/2013 | Lee | |
| 2014/0151639 A1* | 6/2014 | Chang | H01L 29/42392 257/27 |
| 2014/0252454 A1* | 9/2014 | Rabkin | H01L 27/249 257/329 |
| 2014/0264547 A1* | 9/2014 | Kawai | H01L 29/66833 257/324 |
| 2014/0264548 A1 | 9/2014 | Lee et al. | |
| 2015/0069320 A1* | 3/2015 | Rabkin | H01L 21/02403 257/5 |
| 2015/0092494 A1* | 4/2015 | Rhie | G11C 16/16 365/185.12 |
| 2015/0102346 A1 | 4/2015 | Shin et al. | |
| 2015/0179800 A1* | 6/2015 | Biswas | H01L 29/7855 365/189.011 |
| 2016/0035741 A1* | 2/2016 | Tajima | H01L 27/11582 257/324 |
| 2016/0204122 A1* | 7/2016 | Shoji | H01L 27/11582 257/324 |
| 2016/0240665 A1 | 8/2016 | Chen et al. | |
| 2016/0351709 A1* | 12/2016 | Nishikawa | H01L 29/7834 |

FOREIGN PATENT DOCUMENTS

KR  20110021444 A  3/2011
WO  WO2002/015277 A2  2/2002

OTHER PUBLICATIONS

International Search Report & Written Opinion, PCT/US2011/042566, dated Jan. 17, 2012 (30 pp.).
Invitation to Pay Additional Fees & Partial International Search Report, PCT/US2011/042566, dated Sep. 28, 2011. (7 pp.).
Endoh, T. et al., titled "Novel Ultra High Density Memory With a Stacked-Surrounding Gate Transistor (S-SGT) Structured Cell", IEDM Proc. (2001) 33-36.

(56) References Cited

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Kimura, Masahide "3D Cells Make Terabit NAND Flash Possible," Nikkei Electronics Asia, Sep. 17, 2009, 6pgs.
Maeda et al., "Multi-Stacked 1G Cell/Layer Pipe-Shaped BiCS Flash Memory," 2009 Symposium on VLSI Technology Digest of Technical Papers, pp. 22-23.
Tanaka et al., "Bit-Cost Scalable Technology for Low-Cost and Ultrahigh-Density Flash Memory," Toshiba Review, vol. 63, No. 2, 2008, pp. 28-31.
Lue, H.T. et al., A Novel Dual-Channel 3D NAND Flash Featuring both N-Channel and P-Channel NAND Characteristics for Bit-alterable Flash Memory and a New Opportunity in Sensing the Stored Charge in the WL Space, IEEE, IEDMI 13-82, pp. 3.7.1-3.7.4, (2013).
Invitation to Pay Additional Fees and Communication Relating to the Results of the Partial International Search for International Application No. PCT/US2016/028445, 7 pages, dated Jul. 4, 2016.
The International Search Report and Written Opinion of the International Searching Authority for International Application No. PCT/US2016/028445, 19 pages, dated Aug. 25, 2016.
Office Communication from the USPTO for U.S. Appl. No. 14/707,459, dated Aug. 4, 2016, 12 pages.
Notice of Allowance and Fee Due from Corresponding U.S. Appl. No. 14/707,459, dated Jan. 27, 2017, 17 pages.
International Preliminary Report on Patentability and Written Opinion of the International Searching Authority from the International Bureau for International Patent Application No. PCT/US2016/028445, 14 pages, dated Nov. 23, 2017.
Notice of Reasons for Rejection (Office Action), from Japan Patent Office for Japanese Patent Application No. 2017-545900, dated May 29, 2018, 5 pages.

\* cited by examiner

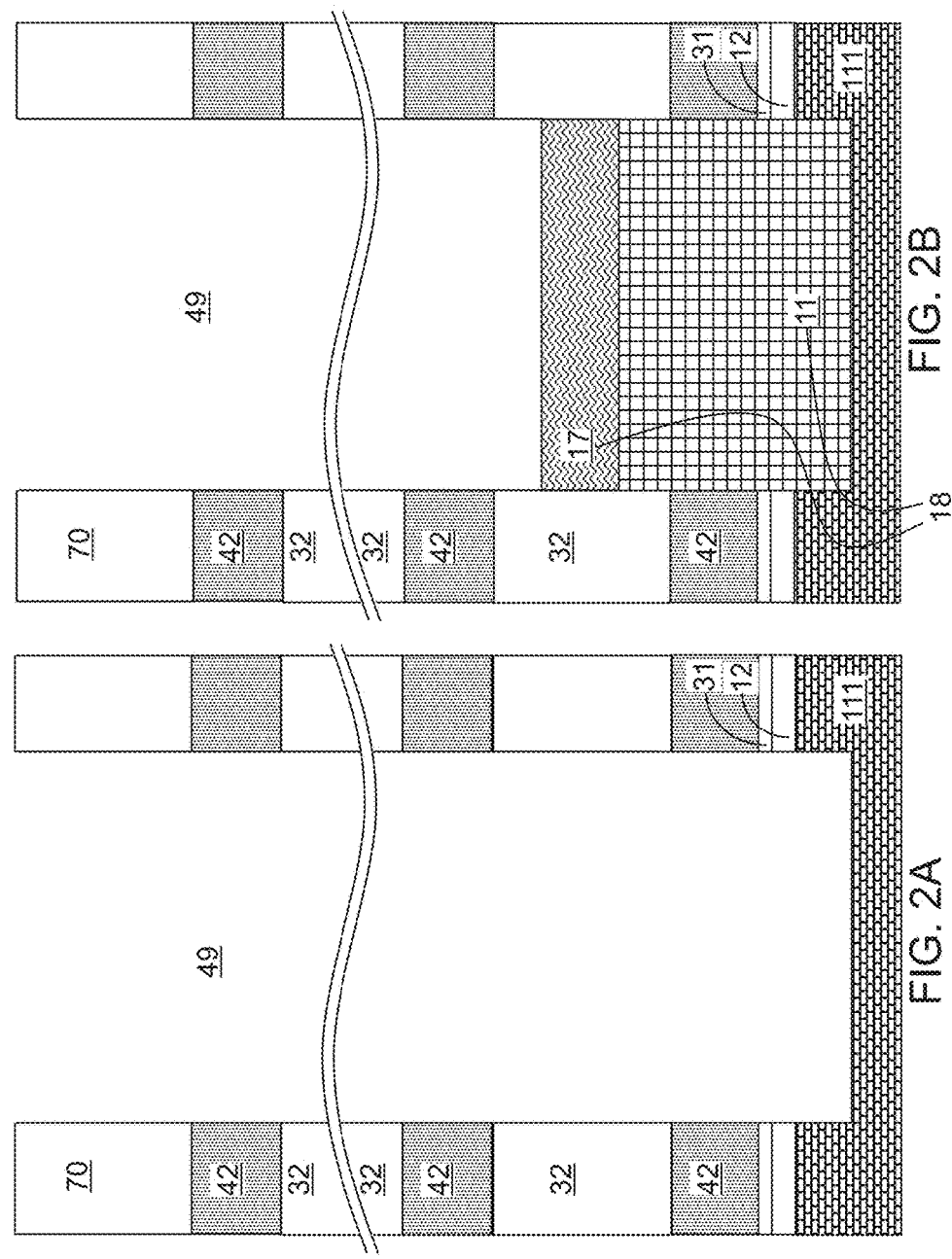

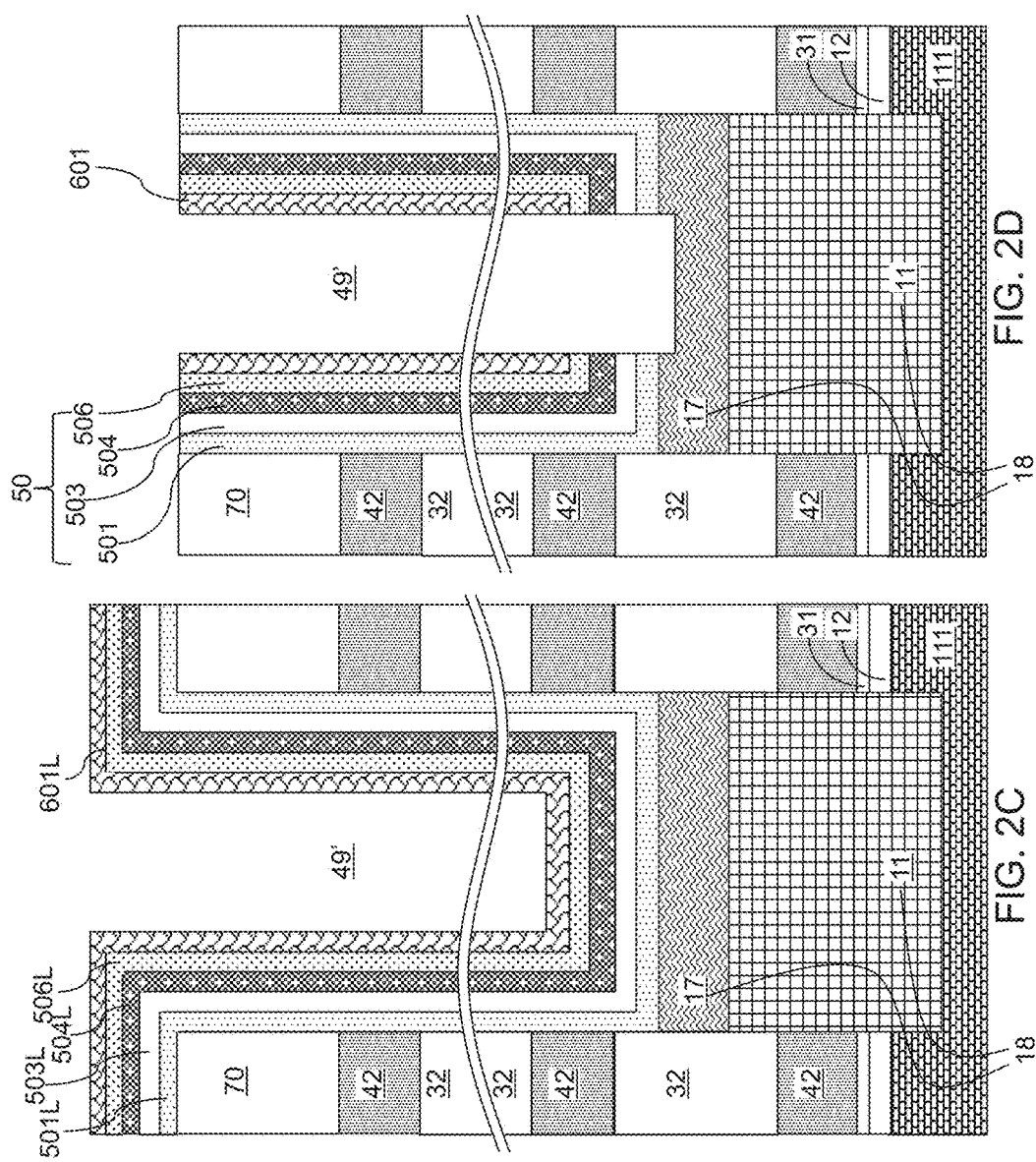

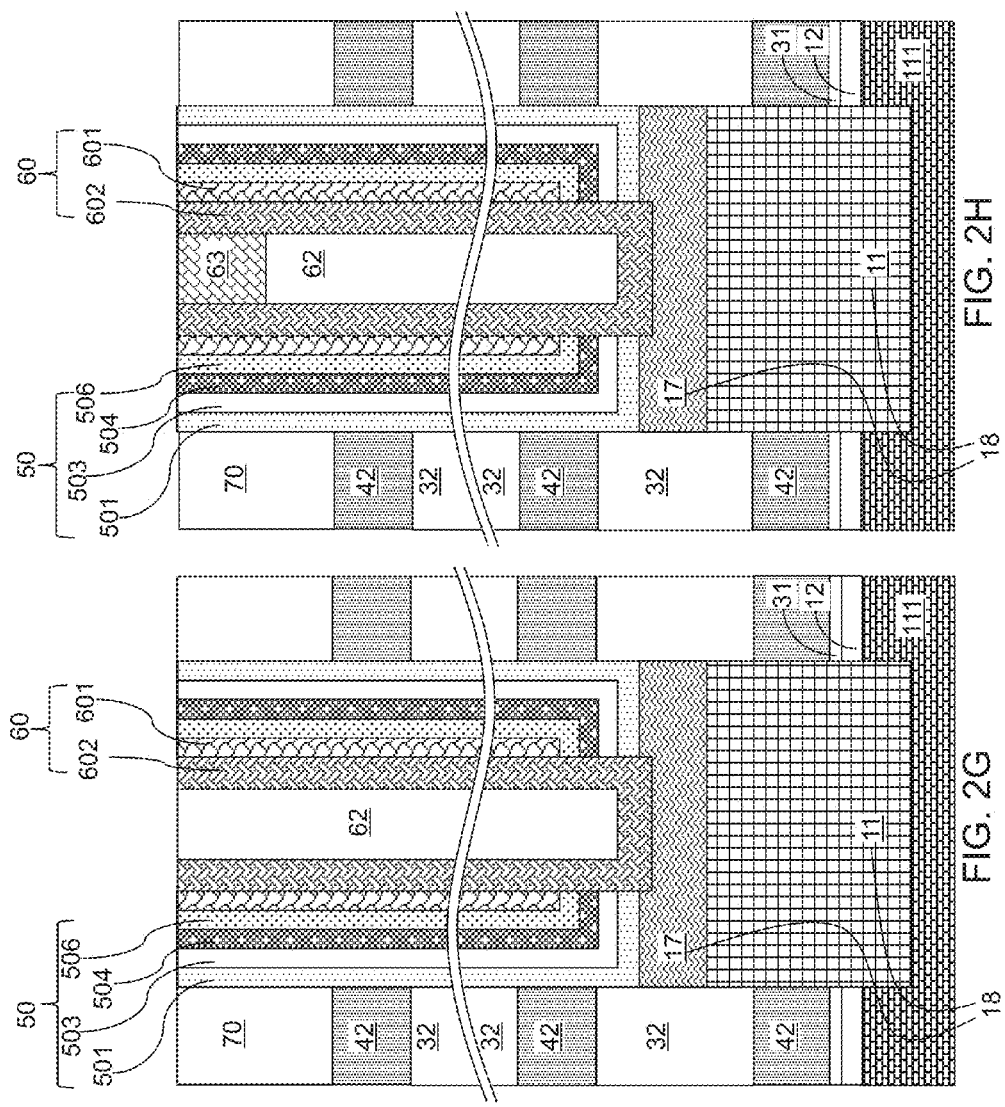

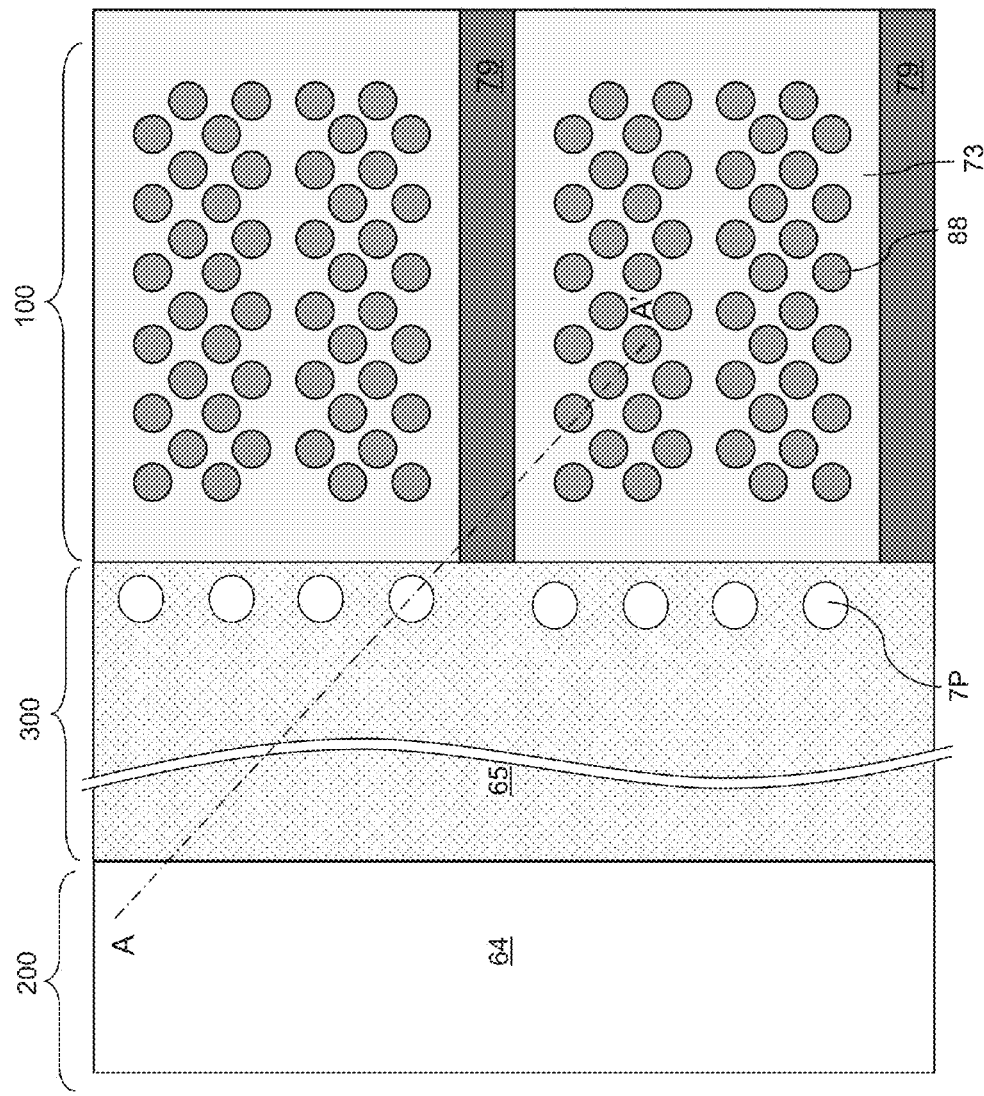

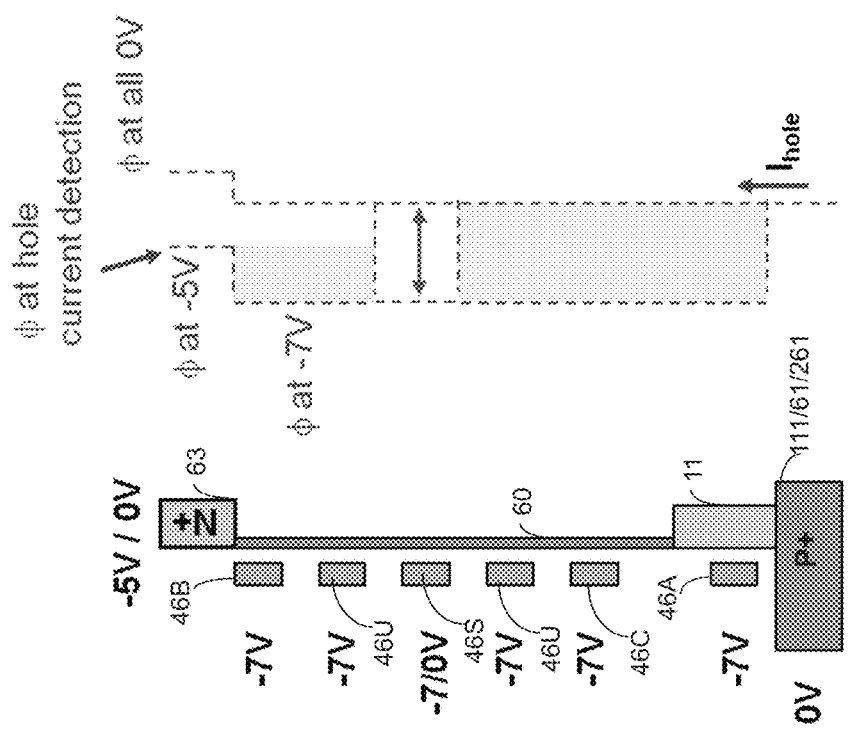

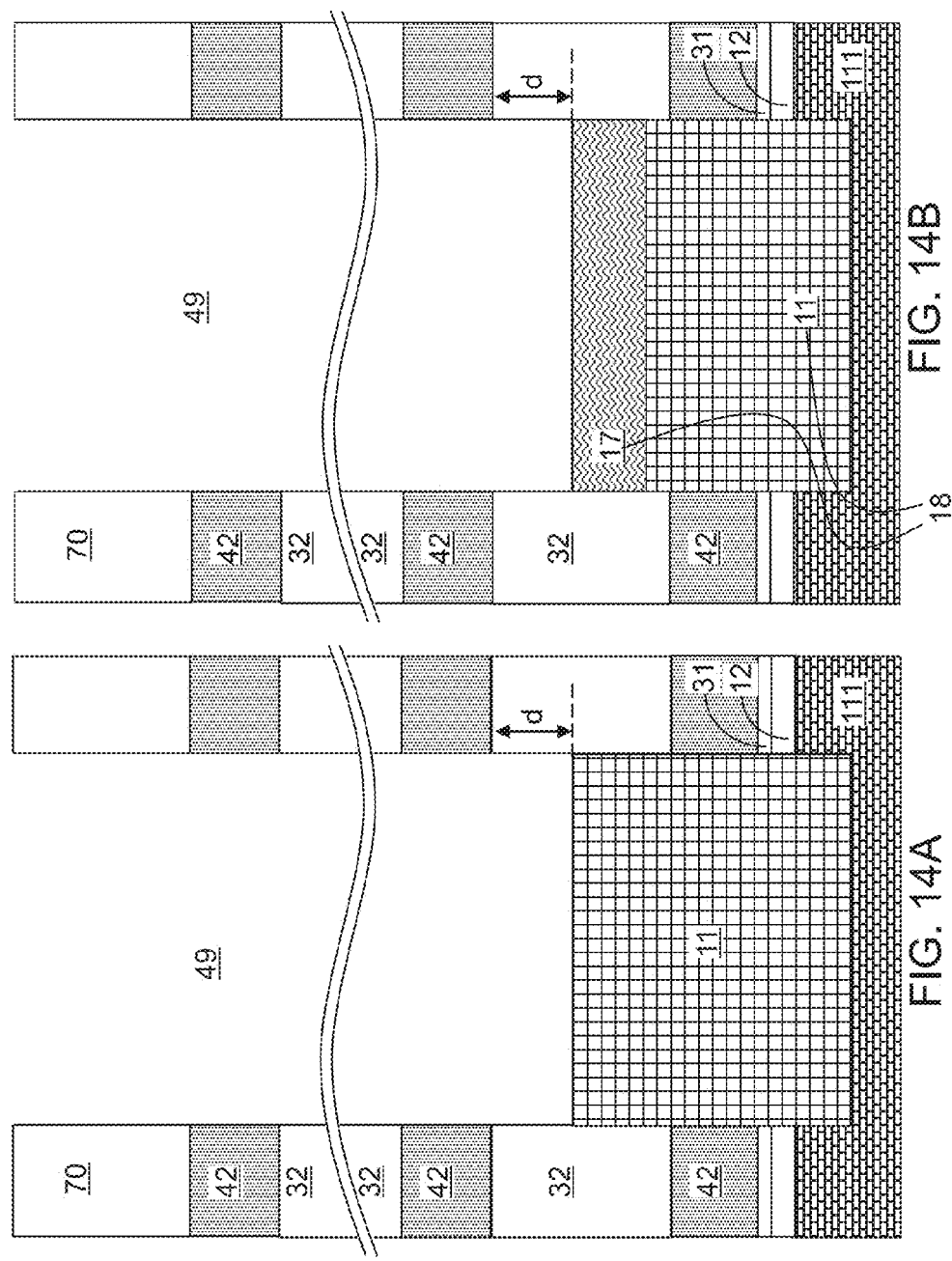

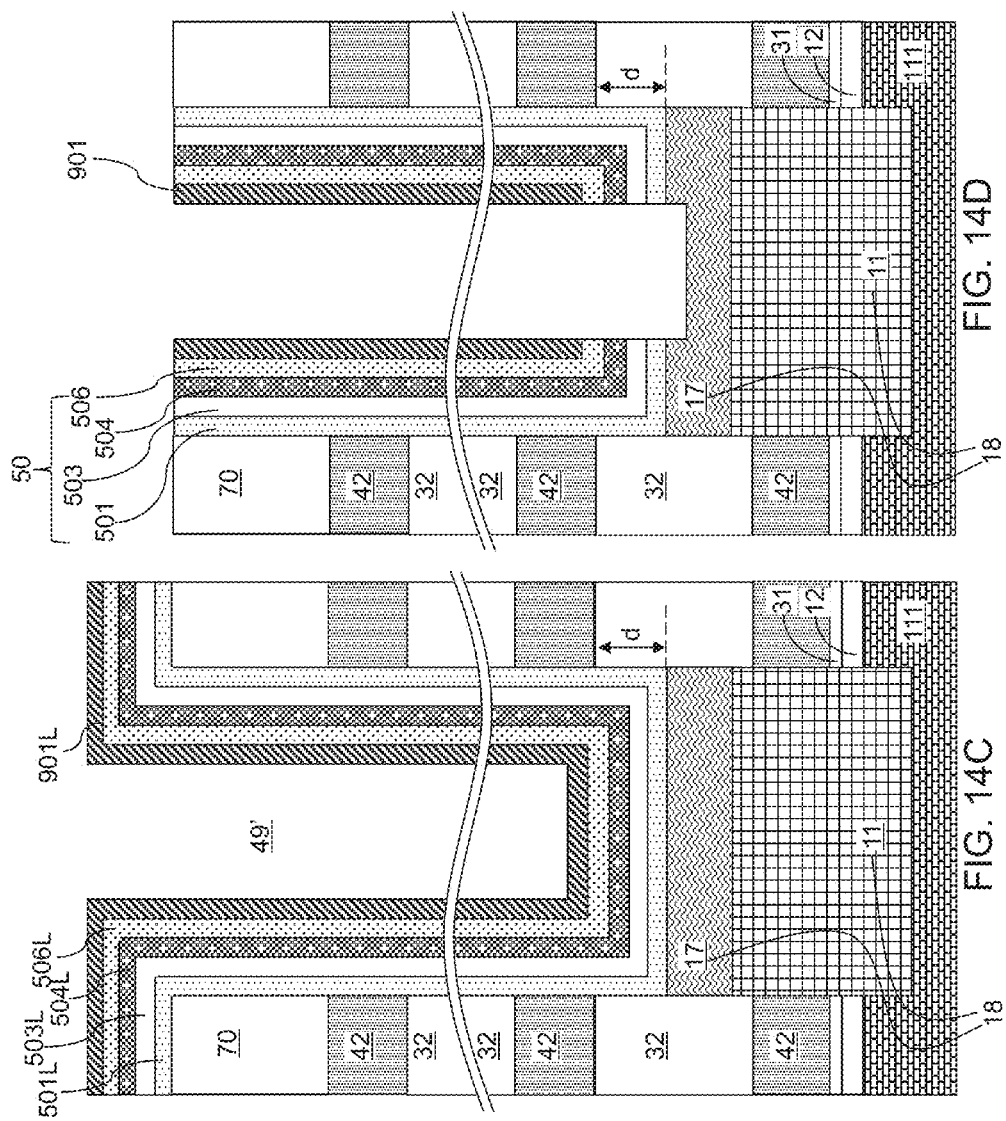

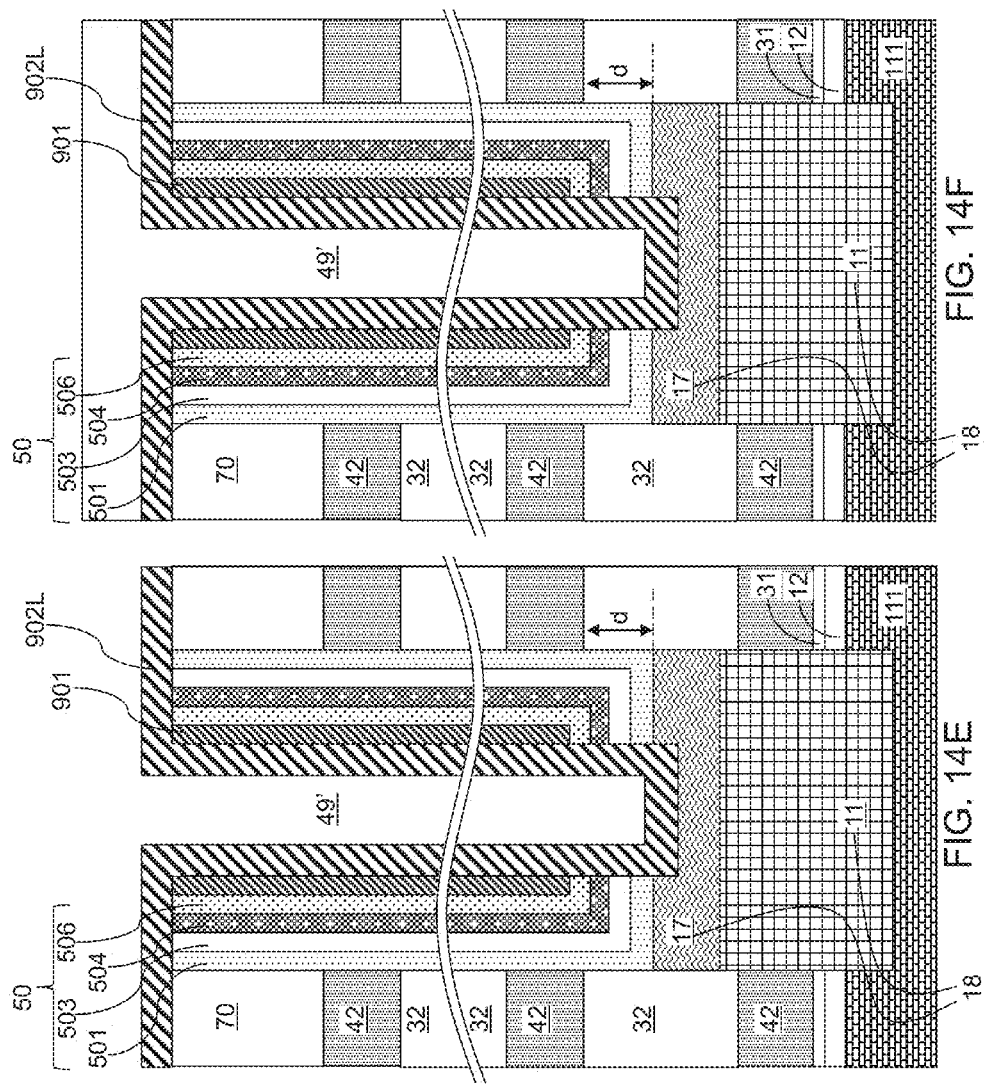

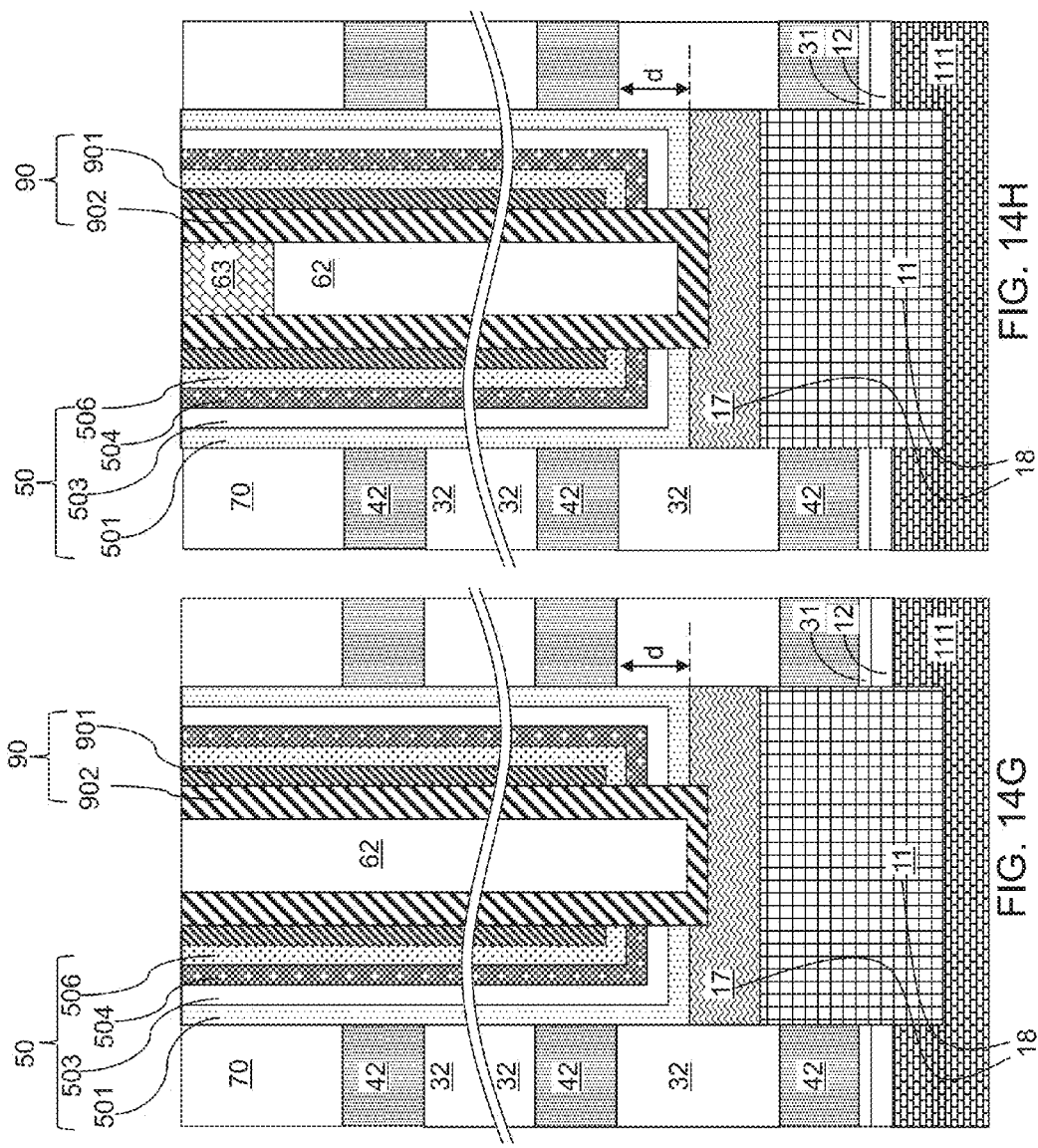

THREE-DIMENSIONAL JUNCTION MEMORY DEVICE AND METHOD READING THEREOF USING HOLE CURRENT DETECTION

FIELD

The present disclosure relates generally to the field of semiconductor devices and specifically to three-dimensional semiconductor devices, such as vertical NAND strings, and methods of making thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which comprises an alternating stack of insulating layers and electrically conductive layers located over a substrate; a memory opening extending through the alternating stack and at least to a top surface of the substrate and containing a memory film therein; a set of doped semiconductor material regions each having a doping of a first conductivity type and collectively extending continuously from underneath the top surface of the substrate through the memory film to a level of a topmost layer of the alternating stack, wherein the set of doped semiconductor material regions includes a doped contact region underlying the top surface of the substrate and a doped semiconductor channel extending through the memory opening; a well contact via structure extending through the alternating stack and physically contacting a top surface of the doped contact region; and an upper semiconductor material region contacting an upper portion of the doped semiconductor channel and having a doping of a second conductivity type, wherein a p-n junction is provided between the upper semiconductor material portion and the doped semiconductor channel.

According to another aspect of the present disclosure, a method of manufacturing a memory device comprises forming a stack of alternating layers comprising first material layers and second material layers over a substrate, forming a memory opening through the stack of alternating layers to a top surface of the substrate, forming a lower doped semiconductor source portion having a doping of a first conductivity type at a lower portion of the memory opening, forming a memory film on a sidewall of the memory opening, forming a semiconductor channel portion on the lower doped semiconductor portion and the memory film, and forming an upper doped semiconductor drain portion having a doping of a second conductivity type on the semiconductor portion, wherein one of the first and second conductivity types is p-type and another of the first and second conductivity types is n-type According to yet another aspect of the present disclosure, a monolithic three-dimensional memory device comprises a stack of alternating layers comprising insulating layers and electrically conductive layers and located over a substrate, and a memory stack structure extending through the stack and comprising a memory film and a semiconductor junction structure vertically extending through the stack substantially perpendicular to a top surface of the substrate. The semiconductor junction structure comprises a semiconductor channel portion, a lower doped semiconductor source portion having a doping of a first conductivity type, and an upper doped semiconductor drain portion having a doping of a second conductivity type such that a junction is located between the semiconductor channel portion and an upper doped semiconductor drain portion. One of the first and second conductivity types is p-type and another of the first and second conductivity types is n-type.

According to an aspect of the present disclosure, a monolithic three-dimensional memory device is provided, which comprises a stack of alternating layers comprising insulating layers and electrically conductive layers and located over a substrate, and a memory stack structure extending through the stack and comprising a memory film and a semiconductor p-i-n junction structure vertically extending through the stack substantially perpendicular to a top surface of the substrate. The semiconductor p-i-n junction structure has a lower junction between an intrinsic semiconductor portion and a lower doped semiconductor portion having a doping of a first conductivity type, and an upper junction between the intrinsic semiconductor portion and an upper doped semiconductor portion having a doping of a second conductivity type. One of the first and second conductivity types is p-type and another of the first and second conductivity types is n-type.

According to another aspect of the present disclosure, a method of reading a nonvolatile memory device comprises providing a nonvolatile memory device comprising a plurality of charge storage elements located between a semiconductor p-i-n junction structure and a plurality of gate electrodes, and reading data stored in the plurality of charge storage elements by measuring a hole current passing through the semiconductor p-i-n junction structure.

According to another aspect of the present disclosure, a method of manufacturing a memory device is provided. A stack of alternating layers comprising first material layers and second material layers is formed over a substrate. A memory opening is formed through the stack of alternating layers to a top surface of the substrate. A lower doped semiconductor portion having a doping of a first conductivity type is formed at a lower portion of the memory opening. A memory film is formed on a sidewall of the memory opening. An intrinsic semiconductor channel portion is formed on the lower doped semiconductor portion and the memory film. An upper doped semiconductor portion having a doping of a second conductivity type is formed on the intrinsic semiconductor portion. One of the first and second conductivity types is p-type and another of the first and second conductivity types is n-type.

BRIEF DESCRIPTION OF THE DRAWINGS

FIGS. 2A-2H are sequential vertical cross-sectional views of a memory opening within the first exemplary structure during various processing steps employed to form a memory stack structure according to the first embodiment of the present disclosure.

FIG. 5B is a partial see-through top-down view of the first exemplary structure of FIG. 5A. The vertical plane A-A' is the plane of the vertical cross-sectional view of FIG. 5A.

FIG. 13A is a schematic diagram of an exemplary device illustrating exemplary voltages applied during a read operation of the device and FIG. 13B is a schematic diagram illustrating distribution of holes during operation of the exemplary device of FIG. 13A.

FIGS. 14A-14H are sequential vertical cross-sectional views of a memory opening within a second exemplary structure during various processing steps employed to form a memory stack structure according to a second embodiment of the present disclosure.

DETAILED DESCRIPTION

Figure 1:
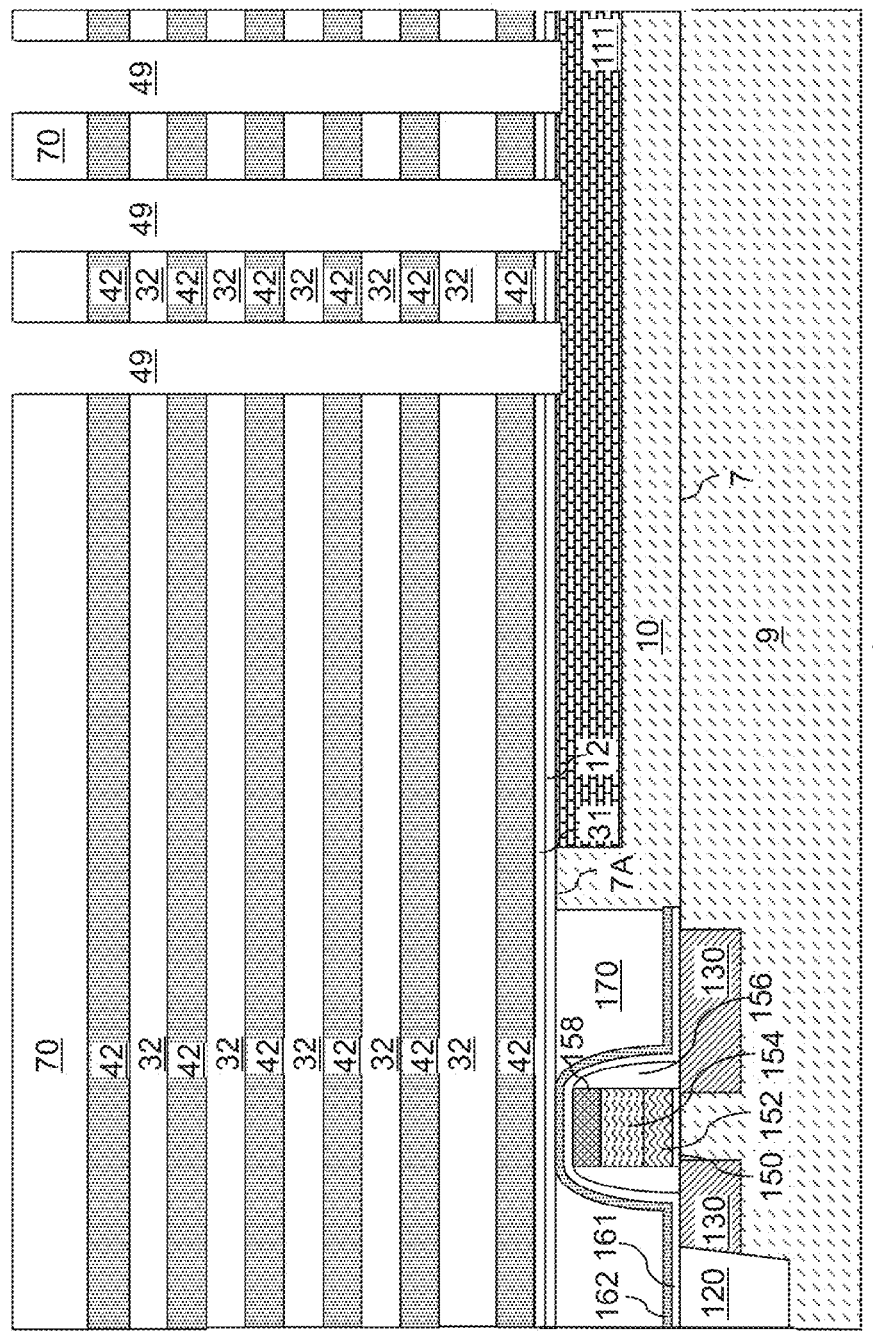
FIG. 1 is a vertical cross-sectional view of a first exemplary structure after formation of a stack including an alternating plurality of material layers and memory openings extending through the stack according to a first embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Same reference numerals refer to the same element having the same material composition, and/or refer to similar elements that provide the same functionality. Unless otherwise indicated, identical composition among elements having the same reference numeral is presumed. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to the first embodiment of the present disclosure is illustrated, which can be employed, for example, to fabricate a device structure containing vertical NAND memory devices. The first exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. A material is "semiconducting" if the electrical conductivity is in a range from $1.0 \times 10^{-6}$ S/cm to $1.0 \times 10^{5}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 having a top surface 7A can be formed on the top surface 7 of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

A doped semiconductor well 111 is formed in an upper portion of the substrate (9, 10). If a semiconductor material layer 10 is present in an upper portion of the substrate (9, 10), the doped semiconductor well 111 can be formed in an upper portion of the semiconductor material layer 10. If the substrate does not include a semiconductor material layer and the topmost surface of the substrate is a surface of the substrate semiconductor layer 9, the doped semiconductor well 111 is formed in an upper portion of the substrate semiconductor layer 9.

The doped semiconductor well 111 can be formed by implantation or diffusion of electrical dopants of a first conductivity type (e.g., p-type or n-type, preferably p-type). The first conductivity type is the conductivity type of the topmost semiconductor layer in the substrate (9, 10). For example, if the substrate (9, 10) comprises the semiconductor material layer 10, the semiconductor material layer 10 and the doped semiconductor well 111 have a doping of the first conductivity type. If the topmost layer of the substrate is the substrate semiconductor layer 9 (i.e., the substrate does not include a semiconductor material layer), the substrate semiconductor layer 9 and the doped semiconductor well 111 have a doping of the first conductivity type. In other words, the doped semiconductor well 111 can be formed by implantation of electrical dopants of the same conductivity type as the doping of the topmost semiconductor material layer in the substrate (9, 10).

The doped semiconductor well 111 may be a lightly or heavily well. In one embodiment, the well may be a heavily doped well having a concentration of electrical in a range from $1.0 \times 10^{18}/cm^3$ to $2.0 \times 10^{21}/cm^3$, although lesser and greater dopant concentrations can also be employed.

In one embodiment, the concentration of electrical dopants of the first conductivity type in the doped semiconductor well 111 can be in a range from $5.0\times10^{19}/\text{cm}^3$ to $2.0\times10^{21}/\text{cm}^3$. The concentration of electrical dopants of the first conductivity type in the layer embedding the doped semiconductor well 111 (which can be the semiconductor material layer 10 or the substrate semiconductor layer 9) can be in a range from $1.0\times10^{15}/\text{cm}^3$ to $1.0\times10^{18}/\text{cm}^3$.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2H illustrate sequential vertical cross-sectional views of a memory opening within the first exemplary structure during formation of an exemplary memory stack structure according to a first embodiment of the present disclosure. Formation of the exemplary memory stack structure can be performed within each of the memory openings 49 in the first exemplary structure illustrated in FIG. 1.

Referring to FIG. 2A, a memory opening 49 in the first exemplary structure of FIG. 1 is illustrated. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an epitaxial pedestal 11 can be formed at the bottom portion of each memory opening 49, for example, by selective epitaxy. The epitaxial pedestal 11 is formed at a bottom of the memory opening 49 by depositing a single crystalline semiconductor material on the physically exposed surface of the substrate (9, 10, 111) employing a selective epitaxial deposition process. The physically exposed surface of the substrate (9, 10, 111) can comprise a recessed top surface and sidewalls of the doped semiconductor well 111. The epitaxial pedestal 11 comprises a single crystalline semiconductor material in epitaxial alignment with the single crystalline semiconductor material of the doped semiconductor well 111. In one embodiment, the epitaxial pedestal 11 can be doped with electrical dopants of the same conductivity type as the doped semiconductor well 111. In one embodiment, the doped semiconductor well 111 can have a doping of the first conductivity type at a first dopant concentration, and the epitaxial pedestal 11 can be formed directly on the doped semiconductor well 111 with a doping of the first conductivity type at a second dopant concentration that is less than the first dopant concentration. In one embodiment, the epitaxial pedestal 11 may be lightly doped (e.g., p-doped) having a concentration of electrical dopants of the first conductivity type in range from $1.0 \times 10^{15}/cm^3$ to $1.0 \times 10^{18}/cm^3$.

In one embodiment, the top surface of each epitaxial pedestal 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial pedestals 11 with a respective conductive material layer.

Electrical dopants of the first conductivity type can be doped (e.g., implanted or diffused) into an upper region of the epitaxial pedestal 11. The implanted region of the epitaxial pedestal 11 is herein referred to as a lower doped semiconductor portion 17. The epitaxial pedestal 11 comprises deposited single crystalline semiconductor material.

Thus, a portion of the epitaxial pedestal 11 is converted into the lower doped semiconductor portion 17 by implanting electrical dopants of the first conductivity type into an upper portion of the deposited single crystalline semiconductor material. The remaining portion of the epitaxial portion 11 has a doping of the first conductivity type at a lower dopant concentration than the lower doped semiconductor portion 17, which has a doping of the first conductivity type. The lower doped semiconductor portion 17 may be heavily doped (e.g., p+ doped) and a concentration of electrical dopants of the first conductivity type in the lower doped semiconductor portion 17 can be a range from $1.0 \times 10^{15}/cm^3$ to $1.0 \times 10^{18}/cm^3$.

The energy of the ion implantation can be selected such that the top surface and the bottom surface of the lower doped semiconductor portion 17 can be located between a first horizontal plane including a top surface of an insulator layer 32 and a second horizontal plane including a bottom surface of the insulator layer 32. Thus, the lower doped semiconductor portion 17 is formed at a lower portion of the memory opening 49. Because the electrical dopants of the first conductivity type are not implanted into a lower portion of the epitaxial pedestal 11 during formation of the lower doped semiconductor portion 17, the lower portion of the epitaxial pedestal 11 that is not converted into the lower doped semiconductor portion 17 remains lightly doped and has a doping of the first conductivity type at a lower dopant concentration than the lower doped semiconductor portion 17 after formation of the lower doped semiconductor portion 17.

Referring to FIG. 2C, a series of layers including at least one blocking dielectric layer (501L, 503L), a memory material layer 504L, a tunneling dielectric layer 506L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

The first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

Subsequently, the memory material layer 504L, the tunneling dielectric layer 506L, and the optional first semiconductor channel layer 601L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L including an intrinsic semiconductor material can be formed. As used herein, an "intrinsic" semiconductor material refers to a semiconductor material that does not include any electrical dopant atoms, or a semiconductor material that includes electrical dopant atoms at an atomic concentration less than $1.0 \times 10^{15}/cm^3$. Thus, the first semiconductor channel layer 601L may include no electrical dopants, may include electrical dopants of the first conductivity type (e.g., p-type) at a dopant concentration less than $1.0 \times 10^{15}/cm^3$.

The first semiconductor channel layer 601L includes can comprise at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 506L 601L).

Referring to FIG. 2D, the optional first semiconductor channel layer 601L, the tunneling dielectric layer 506L, the memory material layer 504L, the at least one blocking dielectric layer (501L, 503L) are sequentially anisotropically etched employing at least one anisotropic etch process. The portions of the first semiconductor channel layer 601L, the tunneling dielectric layer 506L, the memory material layer 504L, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 506L, the memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layer 506L, the memory material layer 504L, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the memory material layer 504L is herein referred to as a charge storage element 504. In one embodiment, the charge storage element 504 can be a continuous layer, i.e., can be a charge storage layer. Each remaining portion of the second blocking dielectric layer 503L is herein referred to as a second blocking dielectric 503. Each remaining portion of the first blocking dielectric layer 501L is herein referred to as a first blocking dielectric 501. A surface of the epitaxial pedestal 11 can be physically exposed underneath the opening through the first semiconductor channel portion 601, the tunneling dielectric 506, the charge storage element 504, and the at least one blocking dielectric (501, 503). Optionally, the physically exposed portion of the epitaxial pedestal 11 can be vertically recessed. A tunneling dielectric 506 is embedded within a charge storage element 504. The charge storage element 504 can comprise a charge trapping material or a floating gate material.

The set of the tunneling dielectric 506, the charge storage element 504, the second blocking dielectric 503, and the first blocking dielectric 501 collectively constitutes a memory film 50. In one embodiment, the first semiconductor channel portion 601, the tunneling dielectric 506, the charge storage element 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Figure 2F:
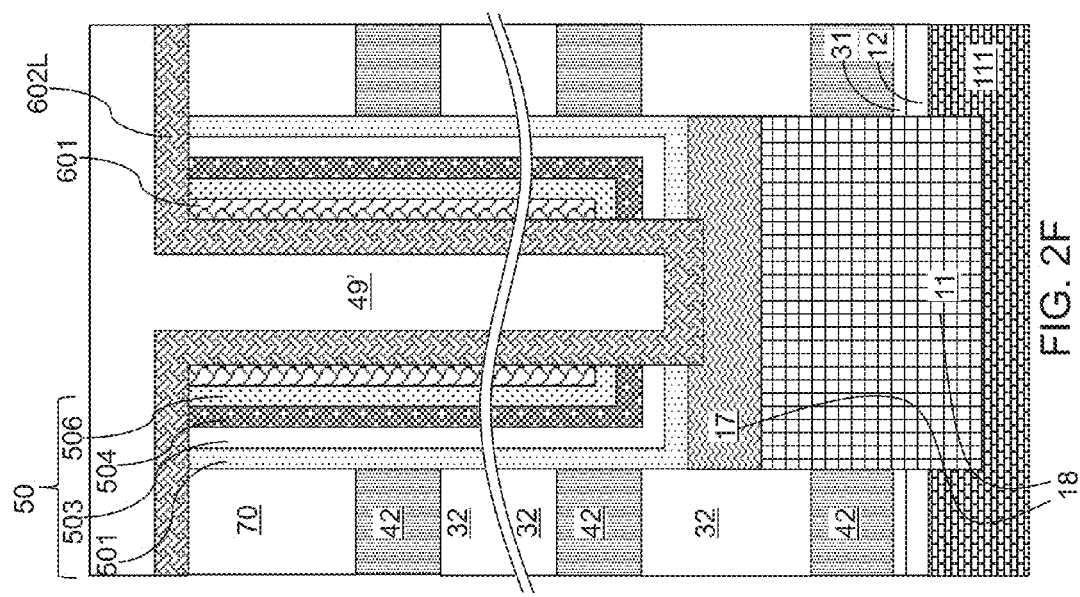
Figure 2E:
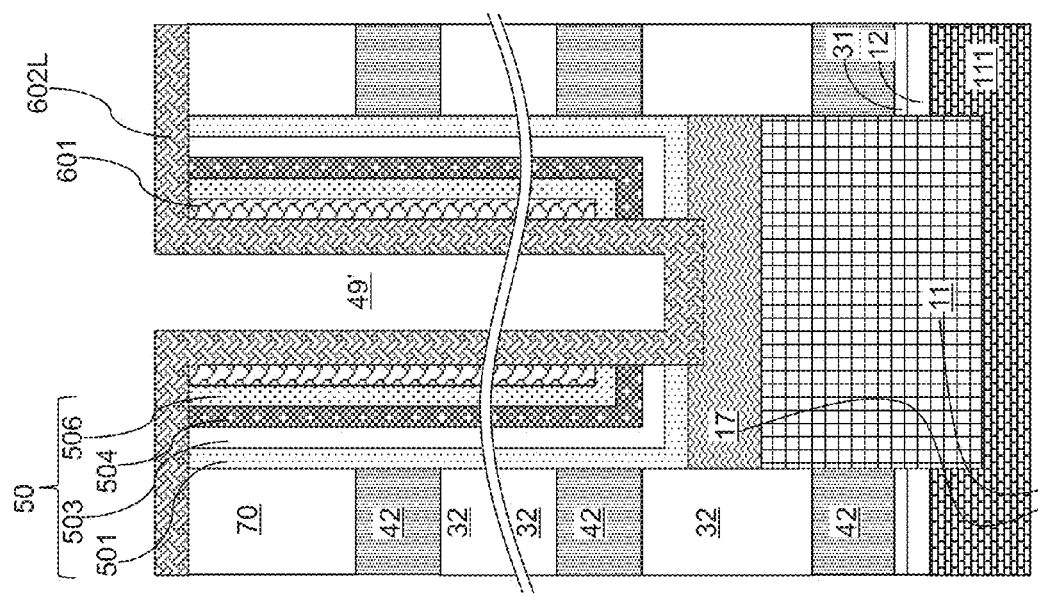

Referring to FIG. 2E, a second semiconductor channel layer 602L can be deposited directly on the semiconductor surface of the lower doped semiconductor portion 17 over the substrate (9, 10), and directly on the first semiconductor channel portion 601. The second semiconductor channel layer 602L includes an intrinsic semiconductor material, i.e., a semiconductor material not including electrical dopants or including electrical dopants at an atomic concentration not greater than $1.0 \times 10^{15}/cm^3$. The intrinsic semiconductor material of the second semiconductor channel layer 602L can be any of the intrinsic semiconductor material that can be employed for the first semiconductor channel layer 601L.

The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L. The entirety of the semiconductor channel material can be an intrinsic semiconductor portion, i.e., a portion of an intrinsic semiconductor material. The intrinsic semiconductor material of the first and second semiconductor channel layers (601L, 602L) can be formed by deposition of at least one polycrystalline semiconductor material such as polysilicon, and/or can be formed by deposition of at least one amorphous semiconductor material such as amorphous silicon and subsequent conversion of the at least one amorphous semiconductor material into at least one polycrystalline semiconductor material. The at least one polycrystalline semiconductor material is herein referred to as a first polycrystalline semiconductor material.

Referring to FIG. 2F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2G, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. The semiconductor channel 60 is an intrinsic semiconductor portion. A tunneling dielectric 506 is embedded within a charge storage element 504, and laterally surrounds a portion of the semiconductor channel 60. Each adjoining set of a first blocking dielectric 501, a second blocking dielectric 503, a charge storage element 504, and a tunneling dielectric 506 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Referring to FIG. 2H, an upper doped semiconductor portion 63 can be formed by depositing a doped semiconductor material having a doping of a second conductivity type (e.g., n-type) within each recessed region above the dielectric cores 62. The second conductivity type is the opposite of the first conductivity type. The upper doped semiconductor portion 63 may be heavily doped (e.g., n+ doped) and a concentration of dopants of the second conductivity type within the upper doped semiconductor portion 63 can be in a range from $1.0 \times 10^{18}/cm^3$ to $2.0 \times 10^{21}/cm^3$, although lesser and greater concentrations of the dopants of the second conductivity type can also be employed. Thus, one of the first and second conductivity types is p-type and another of the first and second conductivity types is n-type. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the upper doped semiconductor portions 63.

A p-i-n junction structure is formed by the combination of the lower doped semiconductor portion 17 having a doping of the first conductivity type, the intrinsic semiconductor portion as embodied as the semiconductor channel 60 which comprises portions (601, 602), and the upper doped semiconductor portion 63 having a doping of the second conductivity type. The p-i-n junction structure (17, 60, 63) vertically extends through the stack of alternating layers (32, 42) substantially perpendicular (e.g., between 0 and 10 degrees) with respect to the top surface (7, 7A) of the substrate (9, 10). An upper junction is formed between the intrinsic semiconductor portion 60 and the upper doped semiconductor portion 63. A lower junction is formed between the intrinsic semiconductor portion (e.g., channel) 60 and the lower doped semiconductor portion 17. In one embodiment, at least one of the second material layers (such as at least one sacrificial material layer 42) can be formed below a horizontal plane including the lower junction, i.e., the junction between the intrinsic semiconductor portion (601, 602) and the lower doped semiconductor portion 17. Thus, portion 17 functions similar to a source, portion 60 functions similar to a channel, and an upper doped semiconductor portion 63 functions similar to a drain of a NAND string, even though they form a multi-gated, vertical p-i-n (or n-i-p) diode structure rather than a typical n-i-n or p-i-p structure of a NAND multi-gate transistor.

A memory stack structure 55 is formed within each memory opening 49. Each memory stack structure comprises an epitaxial pedestal 11, a lower doped semiconductor portion 17, a memory film 50, and an intrinsic semiconductor portion 60. A combination of an adjoining pair of an epitaxial pedestal 11 and a lower doped semiconductor portion 17 is herein referred to as an epitaxial semiconductor portion 18.

Figure 3:
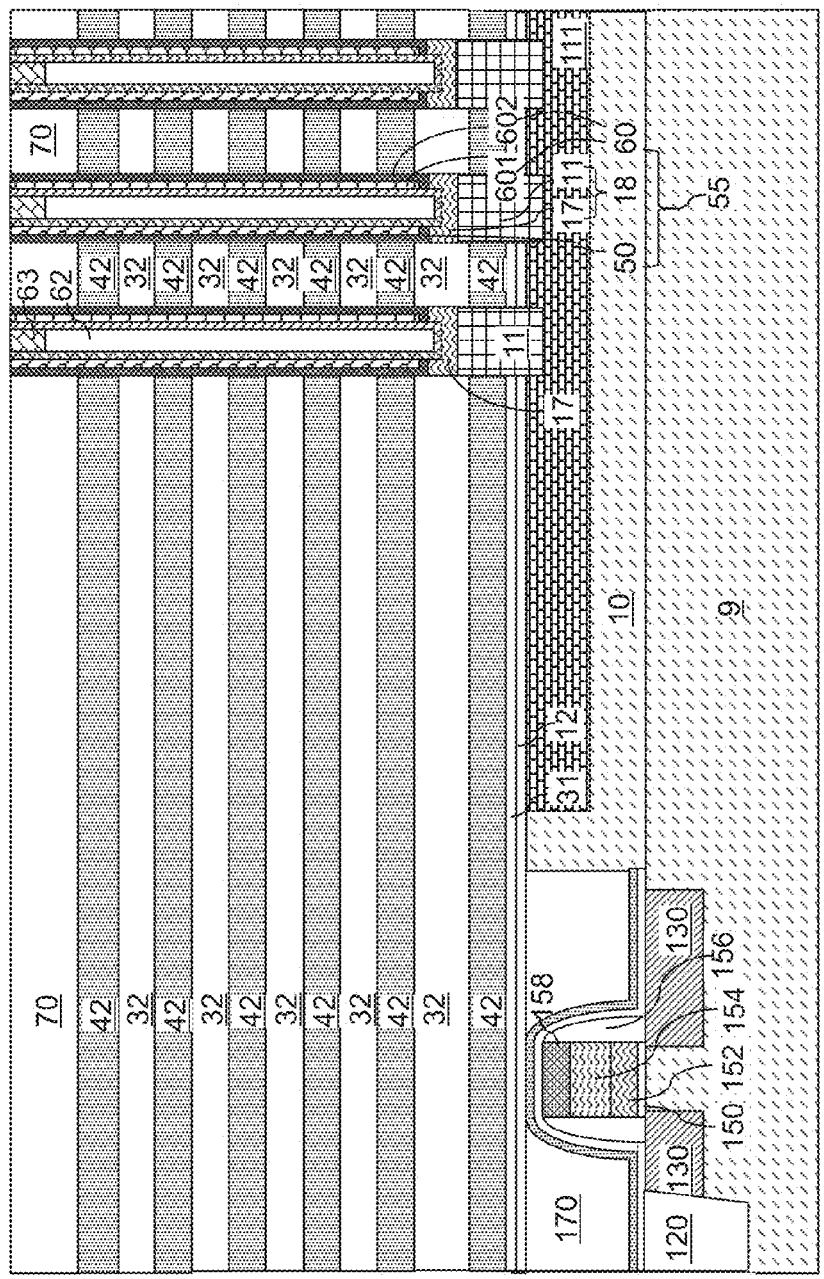
FIG. 3 is a vertical cross-sectional view of the first exemplary structure after formation of memory stack structures according to the first embodiment of the present disclosure.

An instance of the exemplary memory stack structure illustrated in FIG. 2H can be embedded into an instance of a memory opening in the first exemplary structure of FIG. 1. FIG. 3 illustrates the first exemplary structure that incorporates multiple instances of the exemplary memory stack structure of FIG. 2H. The first exemplary structure includes a semiconductor device, which comprises a stack (32, 42) including an alternating plurality of material layers (e.g., the sacrificial material layers 42) and insulating layers 32 located over a semiconductor substrate (9, 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
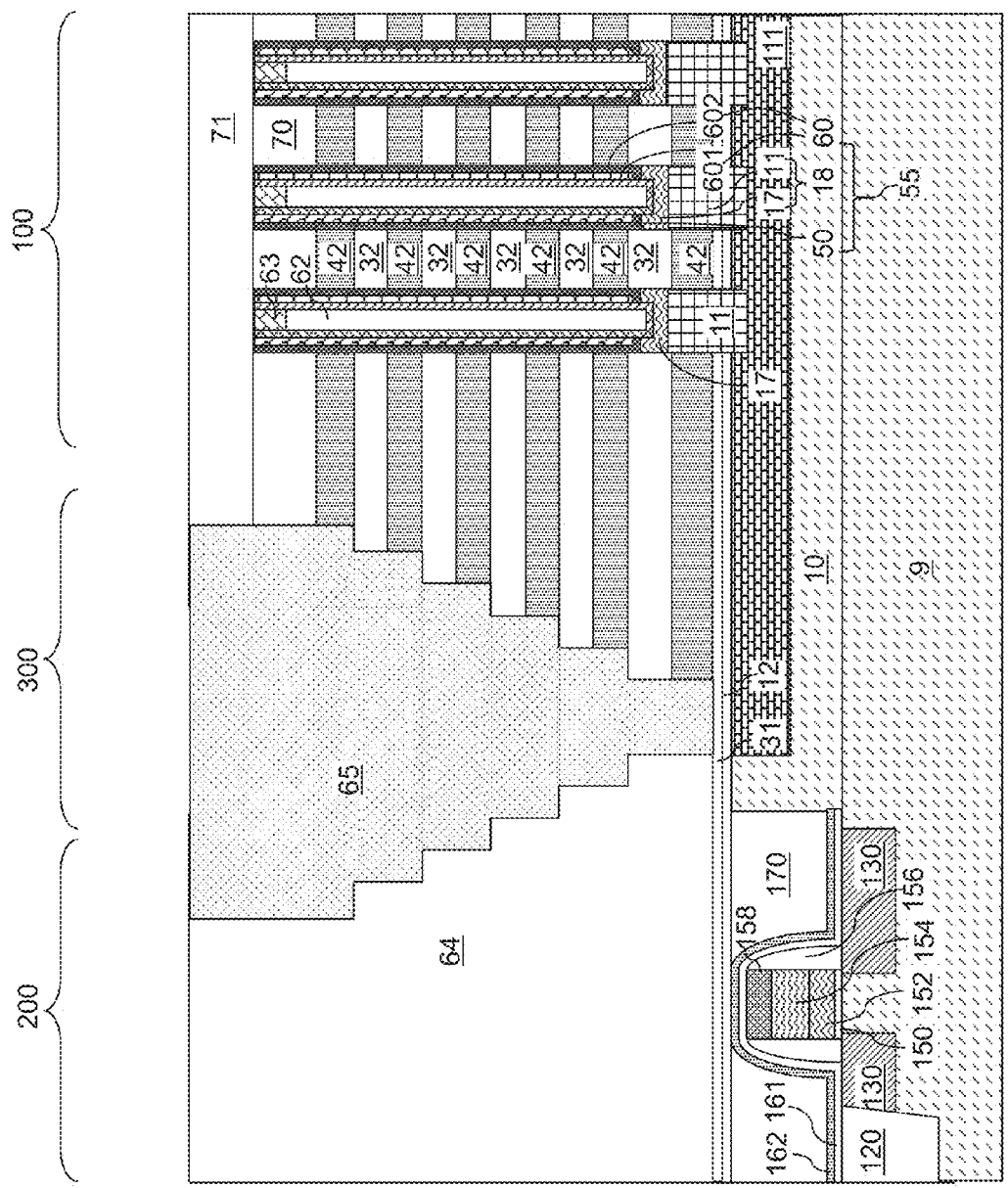
FIG. 4 is a vertical cross-sectional view of the first exemplary structure after formation of a stepped terrace and a retro-stepped dielectric material portion according to the first embodiment of the present disclosure.

Referring to FIG. 4, an optional first contact level dielectric layer 71 can be formed over the substrate (9, 10). As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the upper doped semiconductor portions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a memory device region 100 that includes an array of memory stack structures 55. Subsequently, the trench can be filled with an optional dielectric material such as silicon oxide. Excess portions of the dielectric material can be removed from above the top surface of the first contact level dielectric layer 71 by a planarization process such as chemical mechanical planarization and/or a recess etch. The top surfaces of the first contact level dielectric layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first contact level dielectric layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
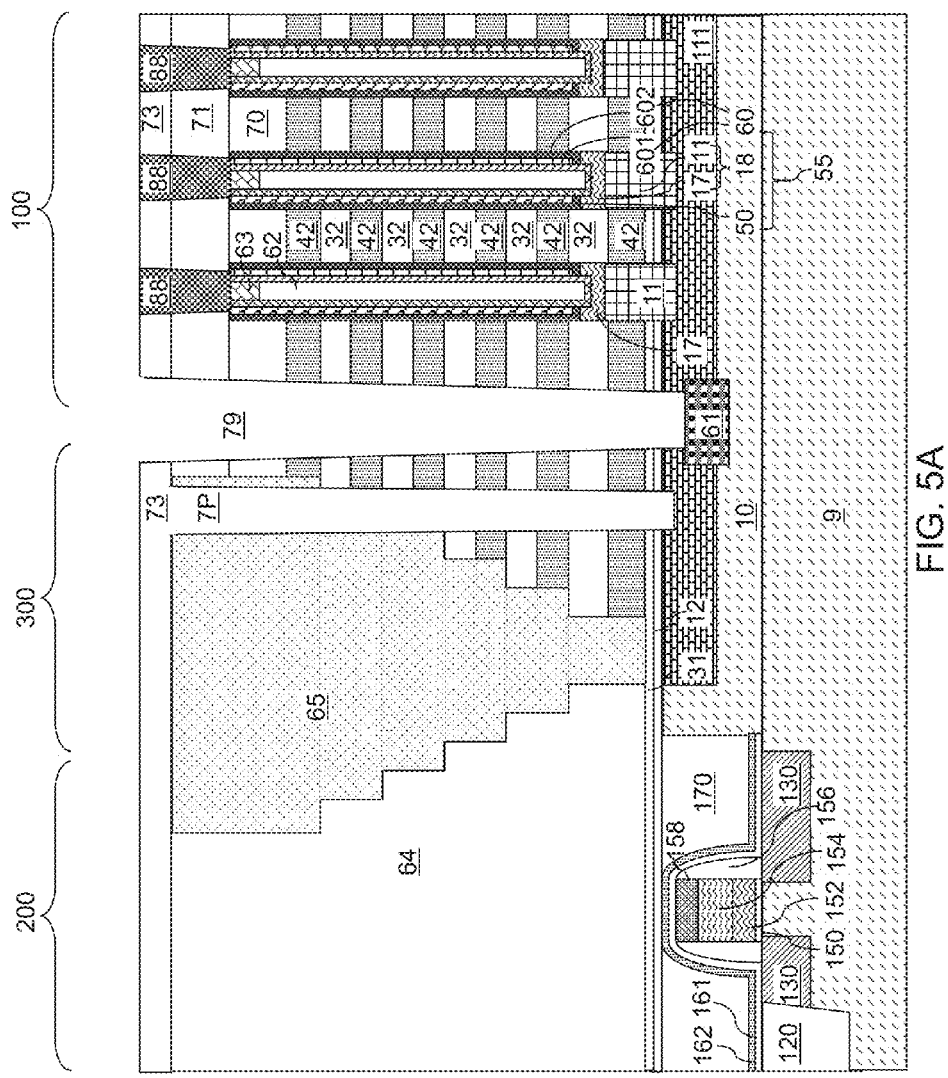
FIG. 5A is a vertical cross-sectional view of the first exemplary structure after formation of a backside trench according to the first embodiment of the present disclosure.

Referring to FIGS. 5A and 5B, at least one dielectric support pillar 7P may be optionally formed through the retro-stepped dielectric material portion 65 and/or through the first contact level dielectric layer 71 and/or through the alternating stack (32, 42). The plane A-A' in FIG. 5B corresponds to the plane of the vertical cross-sectional view of FIG. 5A. In one embodiment, the at least one dielectric support pillar 7P can be formed in the contact region 300, which is located adjacent to the memory device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the first contact level dielectric layer 71 concurrently with deposition of the at least one dielectric support pillar 7P can be present over the first contact level dielectric layer 71 as a second contact level dielectric layer 73. Each of the at least one dielectric support pillar 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a backside contact via structure.

The second contact level dielectric layer 73 and the at least one dielectric support pillar 7P can be formed as a single continuous structure of integral construction, i.e., without any material interface therebetween. In another embodiment, the portion of the dielectric material that is deposited over the first contact level dielectric layer 71 concurrently with deposition of the at least one dielectric support pillar 7P can be removed, for example, by chemical mechanical planarization or a recess etch. In this case, the second contact level dielectric layer 73 is not present, and the top surface of the first contact level dielectric layer 71 can be physically exposed.

Optionally, memory contact via structures 88 can be formed through the first and second contact level dielectric layers (73, 71). Alternatively, the structures 88 may be formed at a later stage in the process, such as during the steps shown in FIG. 11. Specifically, a photoresist layer can be applied over the second contact level dielectric layer 73, and can be lithographically patterned to form openings overlying the upper doped semiconductor portions 63. An anisotropic etch can be performed to transfer the pattern in the photoresist layer through the first and second contact level dielectric layers (73, 71) to form memory contact via cavities that extend through the first and second contact level dielectric layers (73, 71). The memory contact via cavities can be filled with at least one conductive material. Excess portions of the at least one conductive material can be removed from above a horizontal plane including a top surface of the second contact level dielectric layer 73. Each remaining continuous portion of the at least one conductive material constitutes a memory contact via structure 88, which contacts a top surface of an underlying upper doped semiconductor portion 63. The photoresist layer can be subsequently removed, for example, by ashing.

Another photoresist layer (not shown) can be applied over the alternating stack (32, 42) and/or the retro-stepped dielectric material portion 65, and optionally over the and lithographically patterned to form at least one backside trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside trench 79, which extends at least to the top surface of the substrate (9, 10). In one embodiment, the at least one backside trench 79 can include a source contact opening in which a source contact via structure can be subsequently formed. An optional bridging region 61 can be formed by implanting electrical dopants through each backside trench into a semiconductor portion located on, or within, the substrate (9, 10). For example, a bridging region 61 may be formed by diffusion or implantation of dopant atoms into a portion of the semiconductor material layer 10 through each backside trench 79. The bridging region 61 may be heavily doped with dopants of the first conductivity type (e.g., p-type) to assist hole transport in a region that lacks a select gate under an insulating layer 174 that will be formed in a subsequent step shown in FIG. 9. Alternatively, a semiconductor portion can be formed on the substrate (9, 10) by deposition of a semiconductor material, for example, by selective epitaxy, and by implantation, diffusion or in-situ doping of electrical dopants of the first conductivity type into the deposited semiconductor portion.

Figure 6:
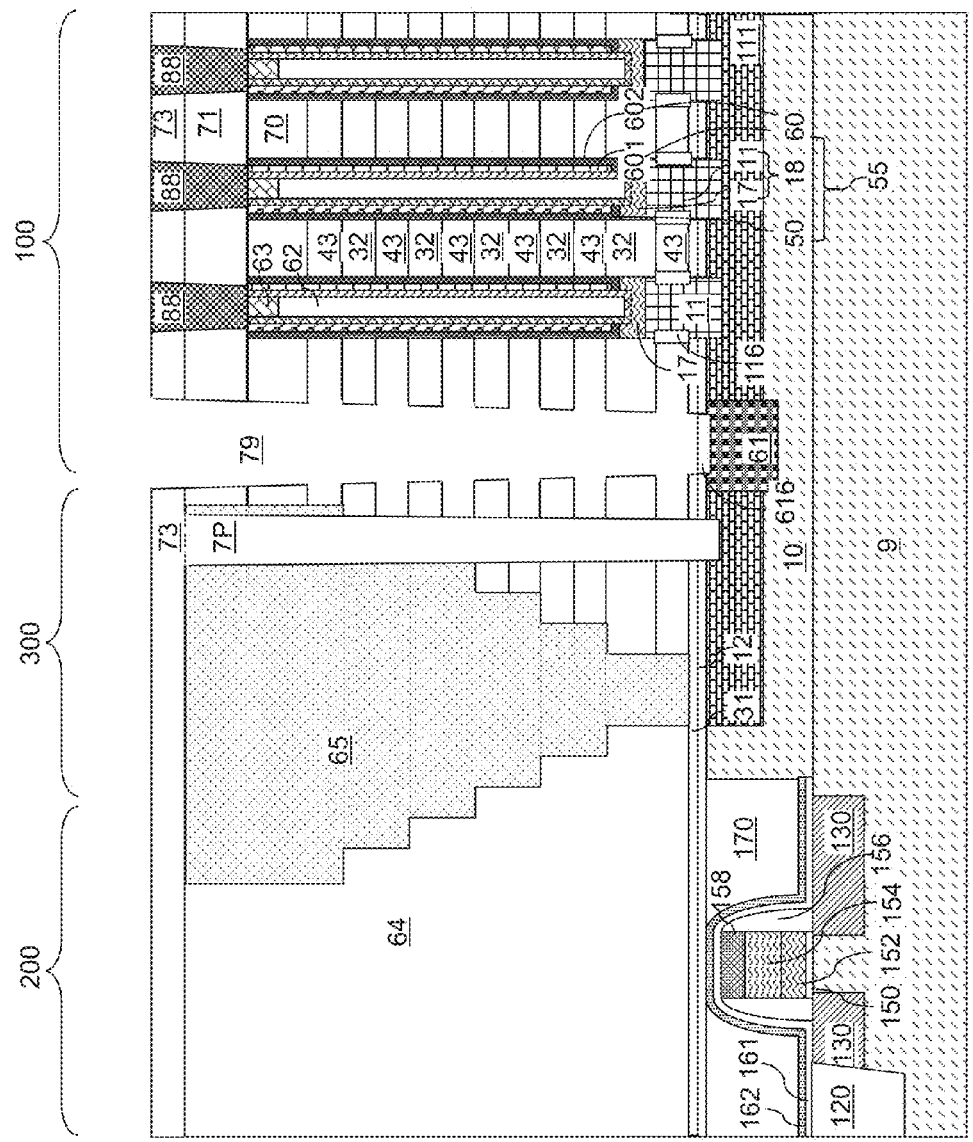
FIG. 6 is a vertical cross-sectional view of the first exemplary structure after formation of backside recesses according to the first embodiment of the present disclosure.

Referring to FIG. 6, an etchant that selectively etches the second material of the sacrificial material layers 42 with respect to the first material of the insulating layers 32 can be introduced into the at least one backside trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside trench 79 can be modified so that the bottommost surface of the at least one backside trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside trench 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the memory device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Figure 7:
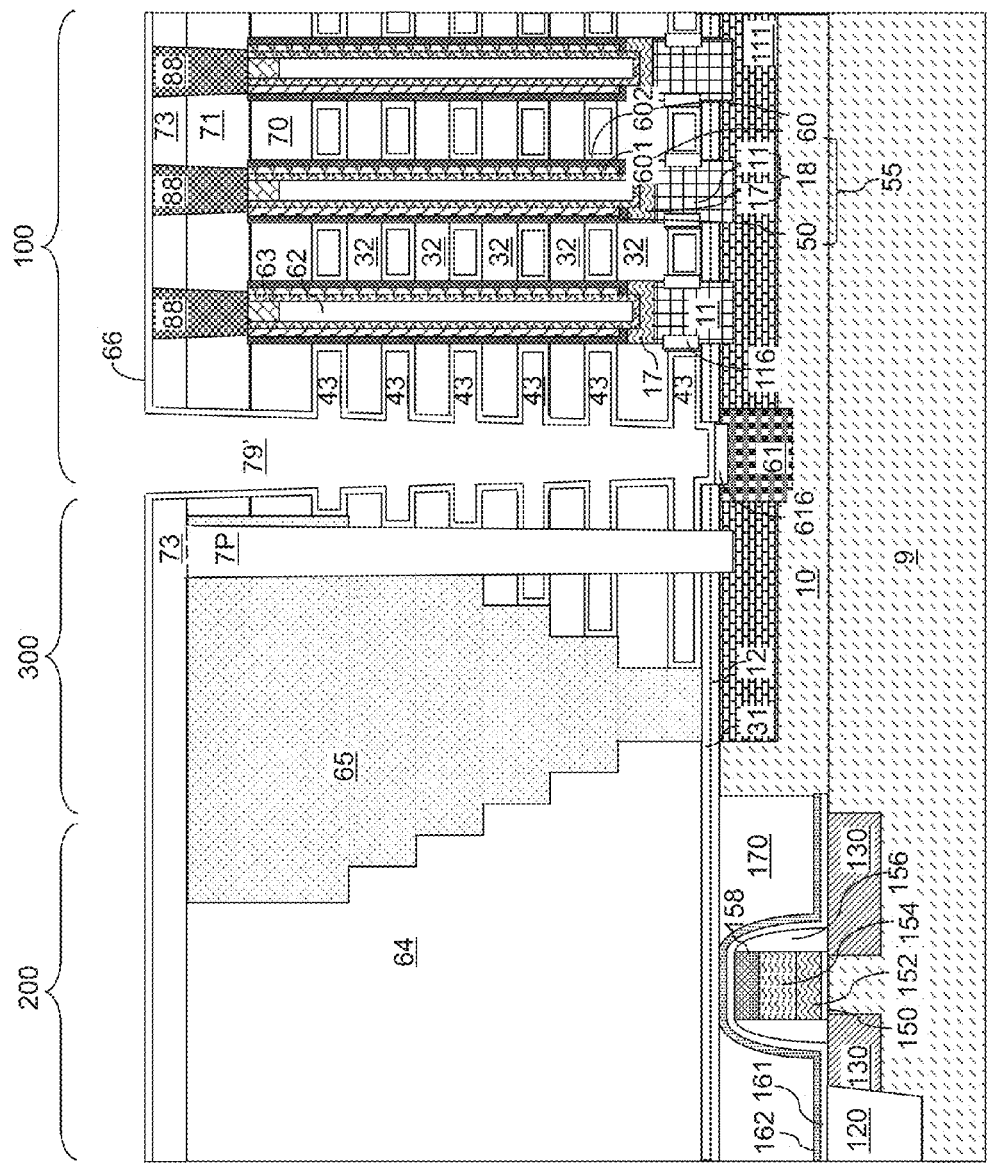
FIG. 7 is a vertical cross-sectional view of the first exemplary structure after formation of a backside blocking dielectric layer according to the first embodiment of the present disclosure.

Referring to FIG. 7, a backside blocking dielectric layer 66 can be optionally formed. The backside blocking dielectric layer 66 comprises a dielectric material that functions as a control gate dielectric for the control gates to be subsequently formed in the backside recesses 43.

In case the at least one blocking dielectric layer (501, 503) is present within each memory opening, the backside blocking dielectric layer 66 is optional. In case the at least one blocking dielectric layer (501, 503) is omitted, the backside blocking dielectric layer 66 is present.

The dielectric material of the backside blocking dielectric layer 66 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. The backside blocking dielectric layer 66 can be deposited by a conformal deposition method such as chemical vapor deposition or atomic layer deposition. The thickness of the backside blocking dielectric layer 66 can be in a range from 1 nm to 10 nm, although lesser and greater thicknesses can also be employed. The backside blocking dielectric layer 66 is formed on the sidewalls of the at least one backside via trench 79, horizontal surfaces and sidewalls of the insulating layers 32, the portions of the sidewall surfaces of the memory stack structures 55 that are physically exposed to the backside recesses 43, and a top surface of a bridging region 61 (if formed prior to formation of the backside blocking dielectric layer 66). A backside cavity 79' is present within the portion of each backside via trench 79 that is not filled with the backside blocking dielectric layer 66.

Figure 8:
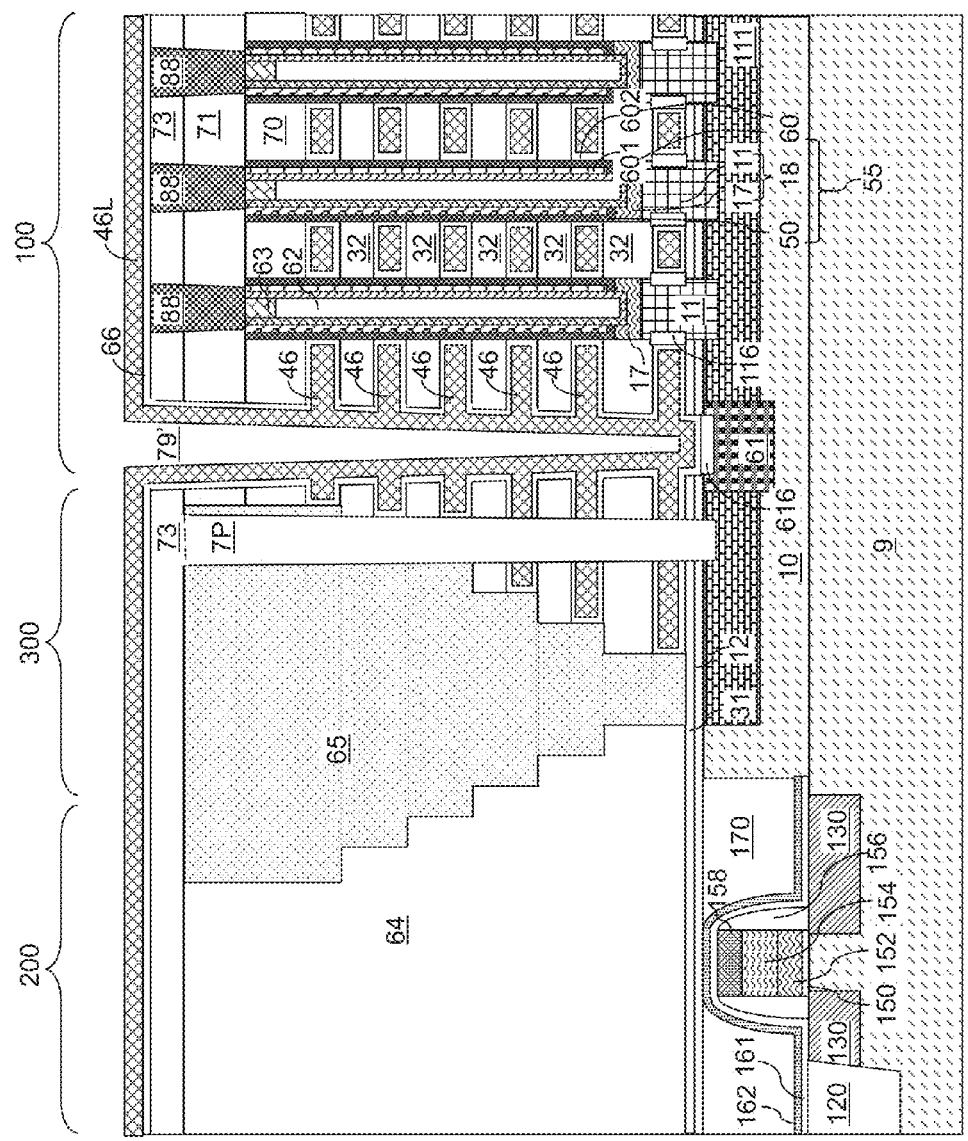
FIG. 8 is a vertical cross-sectional view of the first exemplary structure after formation of electrically conductive layers according to the first embodiment of the present disclosure.

Referring to FIG. 8, at least one metallic material can be deposited in the plurality of backside recesses 43, on the sidewalls of the at least one the backside contact trench 79, and over the top surface of the second contact level dielectric layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material. In one embodiment, the metallic material can be deposited by chemical vapor deposition.

A plurality of electrically conductive layers 46 can be formed in the plurality of backside recesses 43, and a continuous metallic material layer 46L can be formed on the sidewalls of each backside contact trench 79 and over the at least one contact level dielectric layer (71,73). Thus, each sacrificial material layer 42 can be replaced with an electrically conductive layer 46. A backside cavity 79' is present in the portion of each backside contact trench 79 that is not filled with the backside blocking dielectric layer 66 and the continuous metallic material layer 46L. A dielectric spacer 116 laterally surrounds a semiconductor portion that underlies the lower doped semiconductor portion, wherein one of the electrically conductive layers laterally surrounds the dielectric spacer upon formation of the electrically conductive layers.

Figure 9:
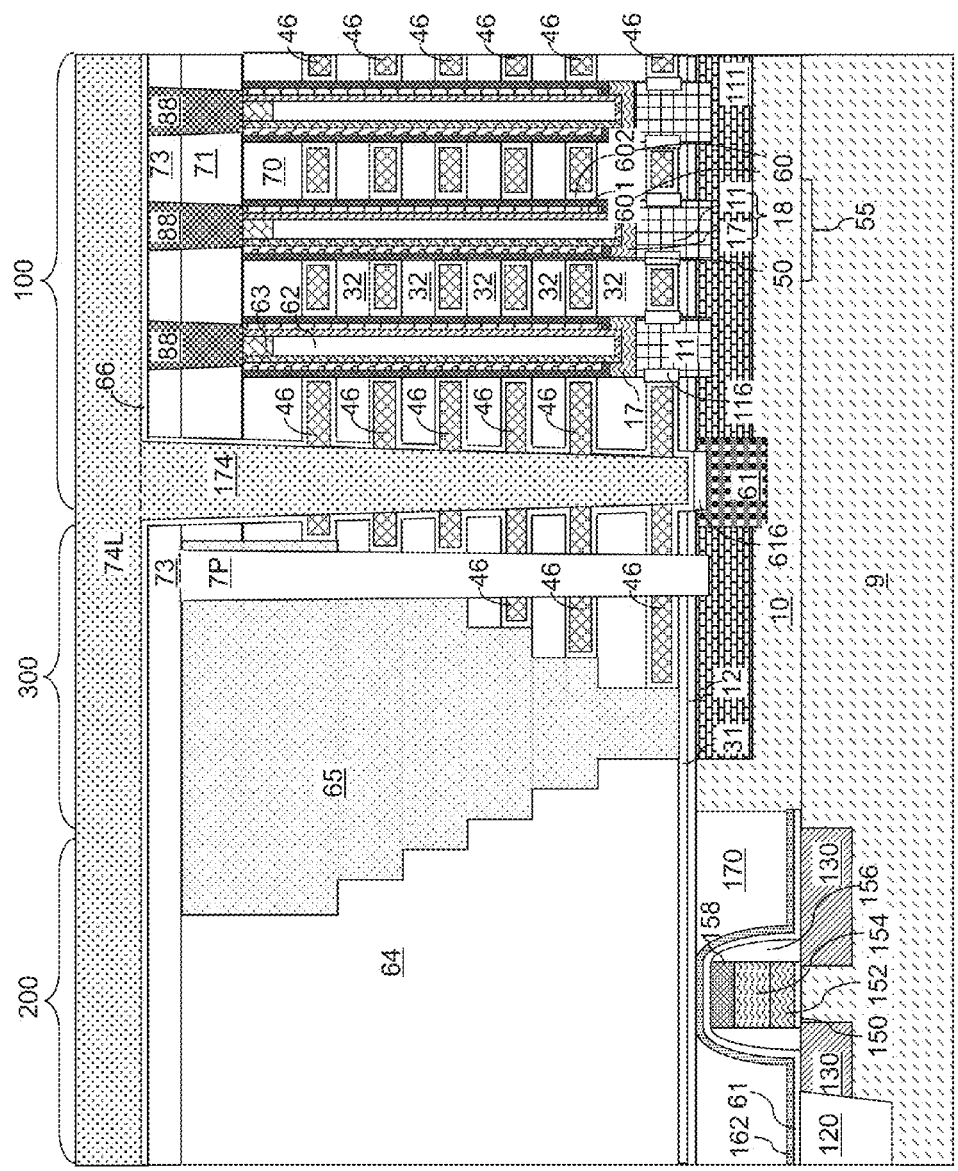
FIG. 9 is a vertical cross-sectional view of the first exemplary structure after removal of a conductive material from inside the backside trench and filling the backside trench with a dielectric fill material according to the first embodiment of the present disclosure.

Referring to FIG. 9, the deposited metallic material of the continuous metallic material layer 46L is etched back from the sidewalls of each backside contact trench 79 and from above the second contact level dielectric layer 73, for example, by an isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. The sacrificial dielectric portion 616 may be, or may not be, removed from above the source regions 61.

Figure 12A:
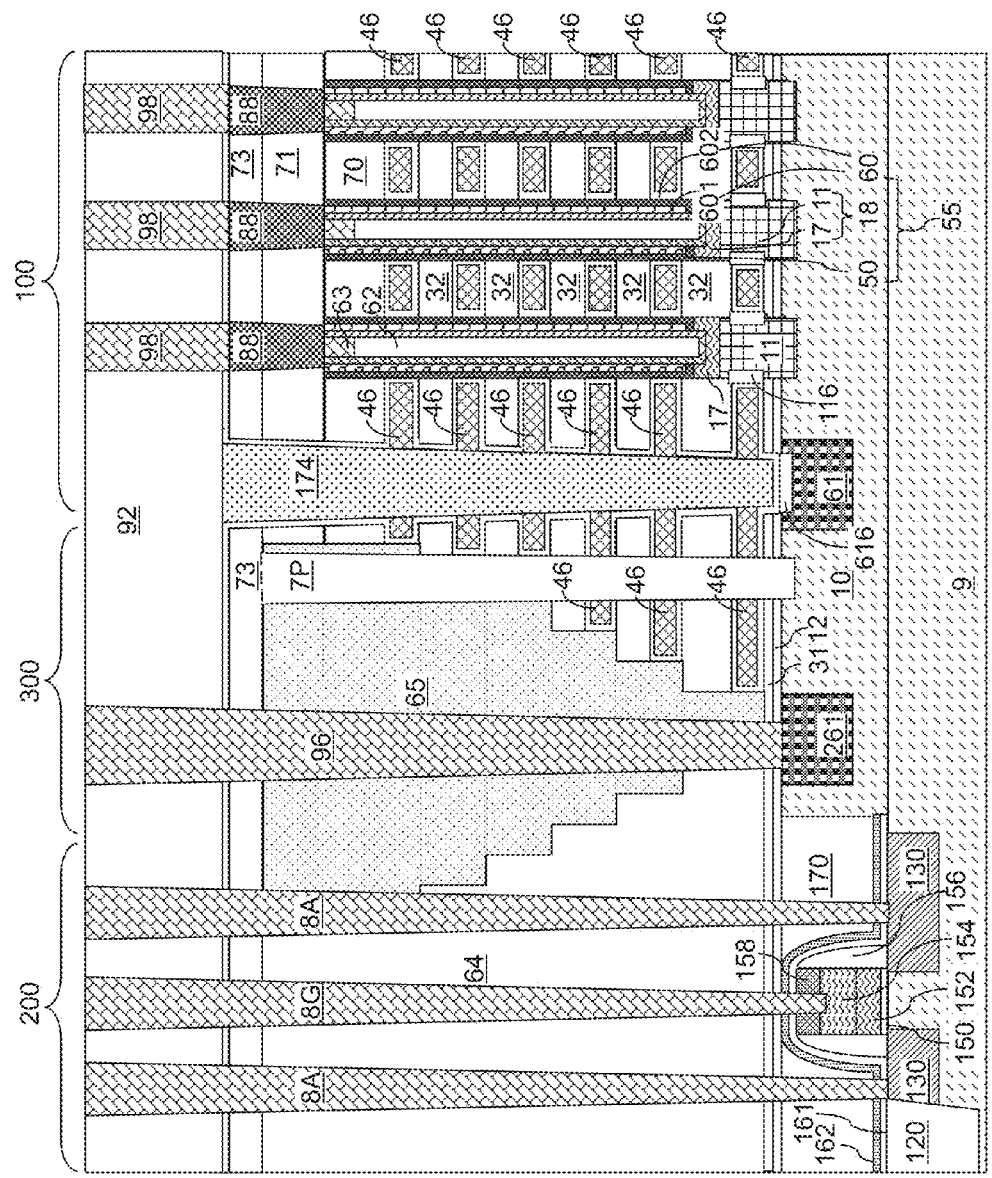
FIG. 12A is a vertical cross-sectional view of a first alternate embodiment of the first exemplary structure according to the first embodiment of the present disclosure.

A cavity is present in the backside contact trench 79 after removal of the conductive material from inside the backside contact trench 79. A trench fill dielectric material is deposited in the cavity to fill the entire volume of the cavity. A trench fill dielectric material portion 174 is formed in the backside contact trench 79. The portion of the deposited trench fill dielectric material over a horizontal plane including the topmost surface of the backside blocking dielectric layer 66 (or a horizontal plane including a topmost dielectric material layer in the first exemplary structure in case a horizontal portion of the backside blocking dielectric layer 66 is not present over the second contact level dielectric layer 73) constitutes a dielectric material layer, which is herein referred to as a first interconnect dielectric material layer 74L. The dielectric material of the trench fill dielectric material portion 174 and the first interconnect dielectric material layer 74L can comprise silicon oxide, organosilicate glass, silicon nitride, a dielectric metal oxide, or a combination thereof. The trench fill dielectric material portion 174 may be optionally removed above layer 73 as shown in FIG. 12A and described below. Thus, there is no source electrode or electrical contact structure in the trenches 79 which horizontally separate adjacent elongated control gate electrodes 46 in the stack.

Figure 10:
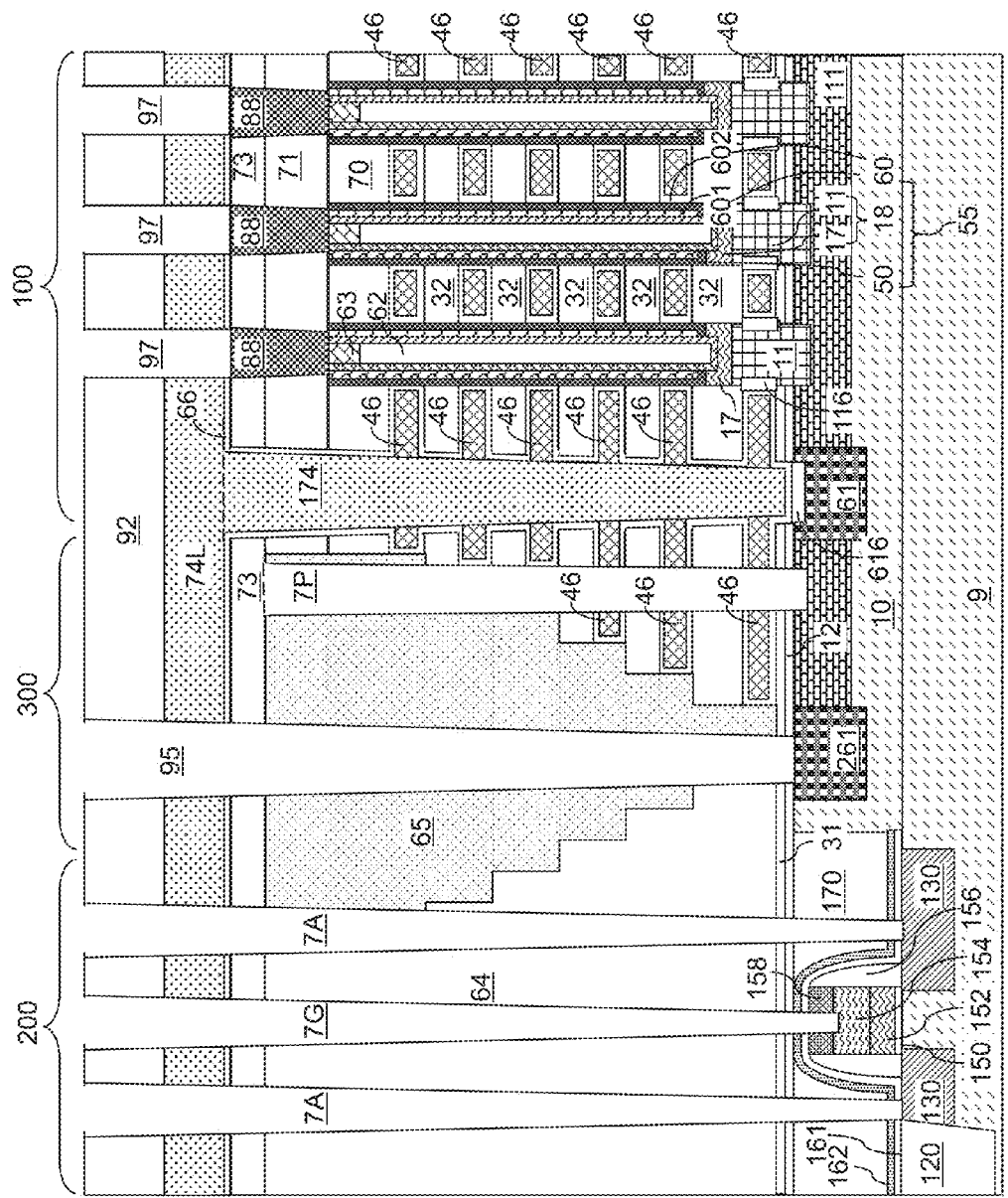
FIG. 10 is a vertical cross-sectional view of the first exemplary structure after formation of various contact via cavities according to the first embodiment of the present disclosure.

Referring to FIG. 10, a second interconnect dielectric material layer 92 can be optionally deposited over the first interconnect dielectric material layer 74L. The second interconnect dielectric material layer 92 includes an interlayer dielectric for an interconnect level, which can be, for example, silicon oxide, porous or non-porous organosilicate glass, silicon nitride, a dielectric metal oxide, or a combination thereof. The second interconnect dielectric material layer 92 can be formed, for example, by chemical vapor deposition. The first and second interconnect dielectric material layers (74L, 92) can be employed as dielectric interlay in which metal interconnect structures can be formed.

A photoresist layer (not shown) can be applied over the topmost layer of the first exemplary structure (which can be, for example, the second interconnect dielectric material layer 92), and can be lithographically patterned to form various openings. The locations and the shapes of the openings in the peripheral device region 200 can be selected to correspond to electrical nodes of the semiconductor devices in the peripheral device region 200 to be electrically contacted by contact via structures. The locations of the openings within the contact region 300 correspond to areas in which formation of contact via structures for the electrically conductive layers 46 is desired. The locations of the openings within the memory device region 100 can be selected to overlie the memory contact via structures 88 (or upper doped semiconductor portions 63 if the memory contact via structures 88 are formed in a later step).

An anisotropic etch is performed to etch through the various layers overlying the electrical nodes of the semiconductor devices in the peripheral device region 200, the various layers overlying the stepped surfaces at the interface between the alternating stack (32, 46) and the retro-stepped dielectric material portion 65 in the contact region 300, and the various layers overlying the memory contact via structures in the memory device region 100 to form via cavities (i.e., openings).

In the peripheral device region 100, at least one gate via cavity 7G can be formed such that the bottom surface of each gate via cavity is a surface of a gate electrode (152, 154), and at least one active region via cavity 7A can be formed such that the bottom surface of each active region via cavity is a surface of an active region 130. Control gate contact via cavities (not shown) can be formed through the retro-stepped dielectric material portion 65 by transfer of the pattern of the opening by an anisotropic etch. Each control gate contact via cavity can vertically extend to a top surface of a respective electrically conductive layer 46. The control gate contact via cavities can extend to horizontal surfaces within the stepped interface between the retro-stepped dielectric material portion 65 and the alternating stack of the insulator layers 32 and the electrically conductive layers 46. Array contact via cavities (i.e., openings) 97 overlying the memory contact via structures 88 (or upper doped semiconductor portions 63 if structures 88 are formed in a later step) can be formed in the memory device region 100. The well contact via cavity 95 may be formed in any suitable region, such as region 300 to the doped semiconductor well 111. If desired, a heavily doped contact region 261 may be formed in the doped semiconductor well 111 through the cavity 95 by ion implantation or diffusion. The heavily doped contact region 261 may be heavily doped with dopants of the first conductivity type (e.g., p+ doped). The photoresist layer can be subsequently removed, for example, by ashing.

Figure 11:
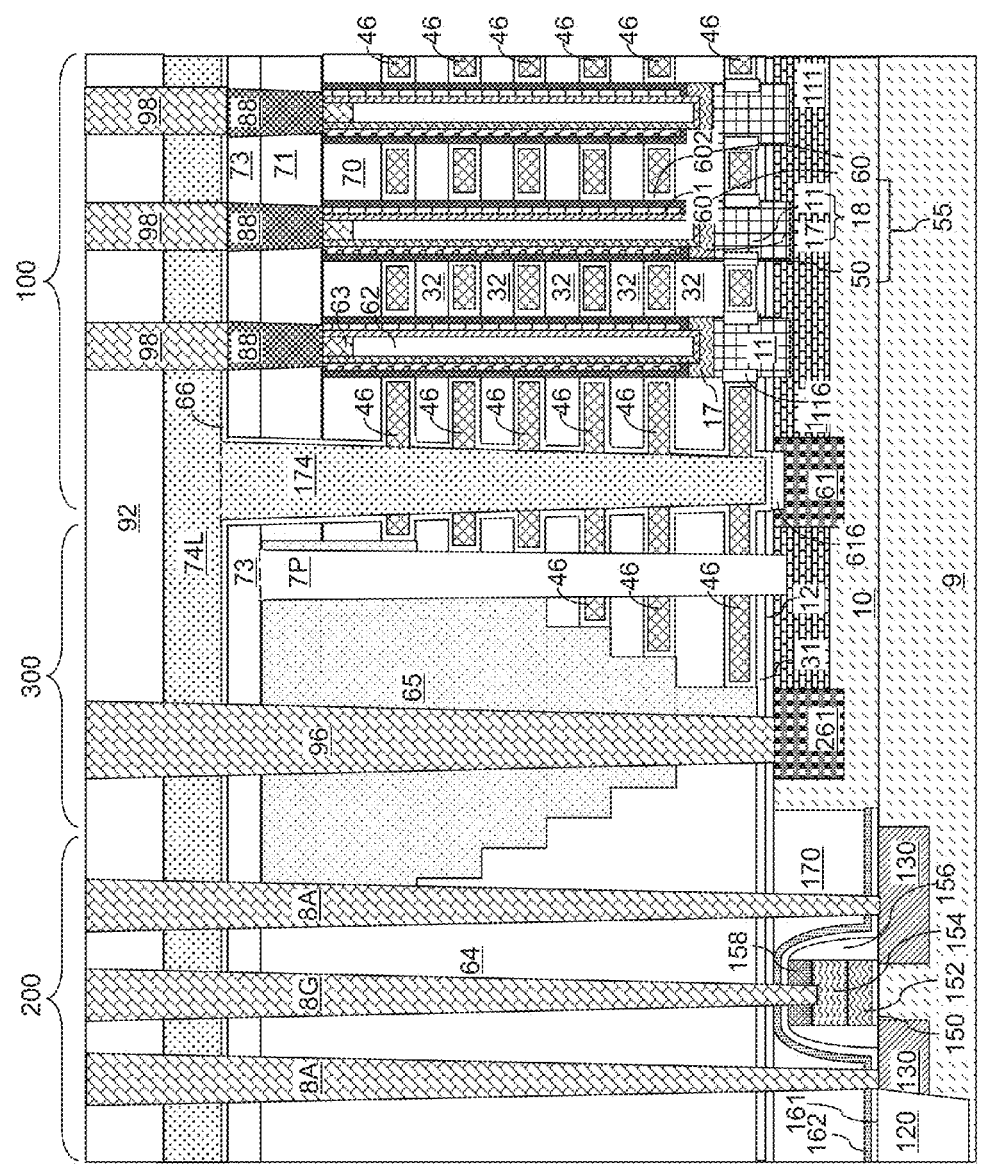
FIG. 11 is a vertical cross-sectional view of the first exemplary structure after formation of various contact via structures according to the first embodiment of the present disclosure.

As shown in FIG. 11, the various via cavities (7A, 7G, 95, 97) can be filled with a conductive material to form various contact via structures (8G, 8A, 96, 98). The contact via structures (8G, 8A, 96, 98) can include for example, at least one gate contact via structure 8G and at least one active region contact via structure 8A that are formed in the peripheral device region 200 in via cavities 7G and 7A, respectively, well contact via structure 95 in the well contact via cavity 95, array contact via structures 98 in the via cavities 97 in memory device region 100, and control gate contact via structures (not shown) that are formed in the contact region 300. The at least one gate contact via structure 8G and the at least one active region contact via structure 8A in the peripheral device region 200 provide electrical contact to various nodes of the peripheral devices in the peripheral device region 200. The well contact via structure 96 contacts the doped semiconductor well 111, or a heavily doped contact region 261 in the doped semiconductor well 111. The array contact via structures 98 in the memory device region 100 can contact the memory contact via structures 88 or contact the upper doped semiconductor portion 63 if structures 88 are omitted. The control gate contact via structures in the contact region 300 can provide electrical contact to the electrically conductive layers 46.

Referring to FIG. 12A, a first alternate embodiment of the first exemplary structure is shown, which can be derived from the first exemplary structure of FIG. 9 by removing the first interconnect dielectric layer 74L by a planarization process. For example, the first interconnect dielectric layer 74L can be removed by a recess etch or chemical mechanical planarization. In this case, the second interconnect dielectric layer 92 can be formed directly on the top surface of the backside blocking dielectric layer 66, the second contact level dielectric layer 73, or the first contact level dielectric layer 71. Thus, the trench fill dielectric material portion 174 does not extend above layer 73.

Optionally, the doped semiconductor well 111 may be omitted, as shown in FIG. 12A. In this embodiment, the semiconductor material layer 10 acts as the horizontal part of the "source" or "channel" through which a read hole current flows between a well contact via structure 96 and array contact via structures 98 (i.e., between the heavily doped contact region 261 and the upper doped semiconductor portion 63). The optional bridging region 61 facilitates hole flow below the trench fill dielectric material portion 174.

Figure 12B:
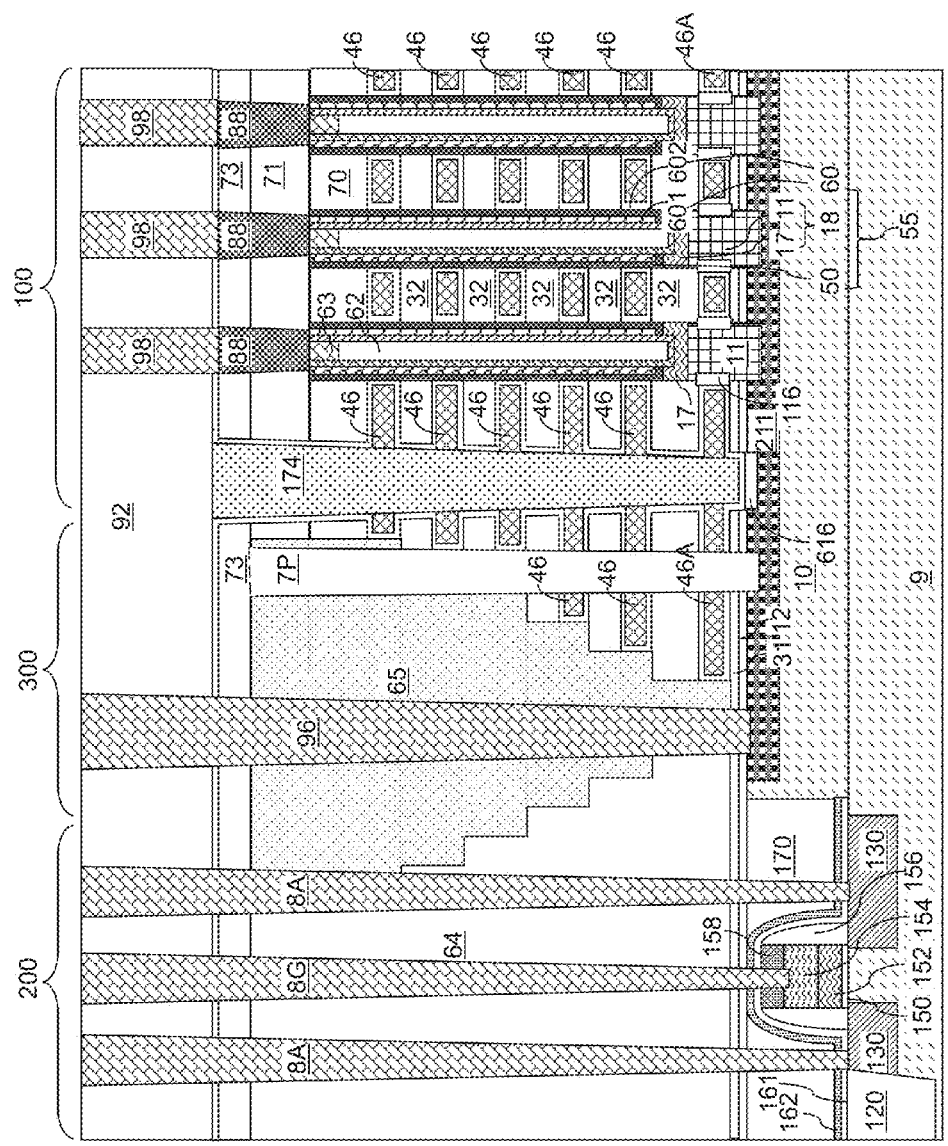
FIG. 12B is a vertical cross-sectional view of a second alternate embodiment of the first exemplary structure according to the first embodiment of the present disclosure.

In a second alternate embodiment, the discrete bridging region 61 and/or the heavily doped contact region 261 may be omitted and replaced by an elongated heavily doped semiconductor region 211 of the first conductivity type (e.g., p+ well), as shown in FIG. 12B. The heavily doped semiconductor region extends between the well contact via structure 96 and the epitaxial pedestals.

In another embodiment, if the device contains plural lower select gate electrodes at the bottom of the stack, then one or more lower select gate electrodes, such as the bottom select gate electrode 46A shown in FIG. 12B may be omitted. Electrode 46A may be omitted because it is not required to create a depletion region for electron transport through layer 10 in case a hole read current flow through the doped semiconductor well 111, the elongated heavily doped semiconductor region 211, or the semiconductor material layer 10 is used during the read operation of the NAND strings.

The first exemplary structure, or various alternate embodiments thereof, can comprise a monolithic three-dimensional memory device. The monolithic three-dimensional memory device can comprise a stack of alternating layers (32, 46) comprising insulating layers 32 and electrically conductive layers 46 and located over a substrate (9, 10, 111 if present, 261 if present, 61 if present, 211 if present). The monolithic three-dimensional memory device further comprises a memory stack structure 55 extending through the stack (32, 46). A p-i-n junction structure (17, 60, 63) vertically extends through the stack (32, 46) substantially perpendicular to the top surface (7, 7A) of the substrate (9, 10, 111 if present, 261 if present, 61 if present, 211 if present). The p-i-n junction structure (17, 60, 63) has a lower junction between an intrinsic semiconductor portion 60 and a lower doped semiconductor portion 17 having a doping of a first conductivity type, and has an upper junction between the intrinsic semiconductor portion 60 and an upper doped semiconductor portion 63 having a doping of a second conductivity type. One of the first and second conductivity types is p-type and another of the first and second conductivity types is n-type. Preferably the first conductivity type is p-type and the second conductivity is n-type.

In one embodiment, the intrinsic semiconductor portion 60 can comprise a first polycrystalline semiconductor material, and the upper doped semiconductor portion 63 can comprise a second polycrystalline semiconductor material. In one embodiment, the lower doped semiconductor portion 17 can comprise a single crystalline semiconductor material. In one embodiment, the lower doped semiconductor portion 17 can be in epitaxial alignment with a single crystalline lattice structure of a semiconductor material in the substrate (9, 10, 111 if present, 261 if present, 61 if present, 211 if present). For example, the lower doped semiconductor portion 17 can be in epitaxial alignment with the single crystalline lattice structure of the doped semiconductor well 111 in the substrate.

An epitaxial material portion, as embodied as an epitaxial pedestal 11, can underlie the lower doped semiconductor portion 17. The epitaxial pedestal 11 can have a doping of the first conductivity type at a lower dopant concentration than the lower doped semiconductor portion 17. The epitaxial pedestal 11 can be in epitaxial alignment with the single crystalline lattice structure of a semiconductor material in the substrate (9, 10, 111 if present, 261 if present, 61 if present, 211 if present) such as the doped semiconductor well 111.

In one embodiment, the substrate (9, 10, 111 if present, 261 if present, 61 if present, 211 if present) can comprise a doped semiconductor well 111 contacting the epitaxial material portion (as embodied as the epitaxial pedestal 11) having a doping of the first conductivity type. In one embodiment, the doped semiconductor well 111 has a doping of the first conductivity type at a higher dopant concentration than the dopant concentration in the epitaxial pedestal 11. The substrate (9, 10, 111 if present, 261 if present, 61 if present, 211 if present) can further comprise a first conductivity type doped semiconductor region (as embodied as the semiconductor material layer 10) located underneath a top surface 7A of the substrate (9, 10, 111 if present, 261 if present, 61 if present, 211 if present), contacting the doped semiconductor well 111, and vertically spaced from the epitaxial pedestal 11 by a region of the doped semiconductor well 111.

In one embodiment, a dielectric spacer 116 can laterally surround the epitaxial pedestal 11. At least one of the electrically conductive layers 46 can laterally surround the dielectric spacer 116.

In one embodiment, the lower junction can be located at an interface between a polycrystalline semiconductor material portion comprising the intrinsic semiconductor portion 60 and a single crystalline semiconductor material portion comprising the lower doped semiconductor portion 17. In one embodiment, the lower junction can be located above a bottommost electrically conductive layer 46 (e.g., lower select gate electrode) among the electrically conductive layers 46 within the stack of alternating layers (32, 46). Alternatively, if the lowest select gate electrode 46A is omitted, then the lower junction is located below the remaining bottommost electrically conductive layer 46 (e.g., remaining lowest select gate electrode).

In one embodiment, a trench vertically extends from a first horizontal plane including a topmost surface of the stack of alternating layers (32, 46) to a second horizontal plane including a bottommost surface of the stack of alternating layers (32, 46). A trench fill dielectric material portion 174 is located in the trench, preferably completely fills the trench, and contacts a sidewall of each of the electrically conductive layers 46.

In one embodiment, the memory stack structure 55 can be located within a memory opening extending through the stack of alternating layers and comprises a memory film 50 that contacts a sidewall of the memory opening. In one embodiment, the memory film 50 comprises, from outside to inside, a blocking dielectric layer (501, 503), a memory material layer 504, and a tunneling dielectric layer 506.

In one embodiment, the monolithic three-dimensional memory device comprises a vertical NAND device located over the substrate (9, 10, 111 if present, 261 if present, 61 if present, 211 if present). The electrically conductive layers 46 comprise, or are electrically connected to, a respective word line of the vertical NAND device. The substrate can comprise a silicon substrate. The vertical NAND device can comprise an array of monolithic three-dimensional NAND strings located over the silicon substrate. At least one memory cell in a first device level of the three-dimensional array of NAND strings is located over another memory cell in a second device level of the three-dimensional array of NAND strings. The silicon substrate can contain an integrated circuit comprising a driver circuit for the memory device located thereon.

In one embodiment, the array of monolithic three-dimensional NAND strings can comprise a plurality of semiconductor channels (60), wherein at least one end portion of each of the plurality of semiconductor channels extends substantially perpendicular to a top surface of the substrate. The array of monolithic three-dimensional NAND strings can comprise a plurality of charge storage elements. Each charge storage element can be located adjacent to a respective one of the plurality of semiconductor channels. The array of monolithic three-dimensional NAND strings can comprise a plurality of control gate electrodes (as embodied as a subset of electrically conductive layers 46) having a strip shape extending substantially parallel to the top surface of the substrate. The plurality of control gate electrodes can comprise at least a first control gate electrode located in the first device level and a second control gate electrode located in the second device level.

In one embodiment, the monolithic three-dimensional memory device of the first embodiment of the present disclosure can be programmed to store data by storing electrical charge in memory elements within the memory stack structure 55. The data can be read by measuring electrical current passing through the p-i-n junction structure (17, 60, 63). Preferably, a hole current (i.e., flow of holes) flowing from the lower doped semiconductor portion 17 through the channel 60 to the upper doped semiconductor portion 63 is used during the read operation. The charge carriers of the first conductivity type (e.g. holes) can be supplied from the doped well region 111 or the heavily doped contact region 261, if present, and flow from the doped well region 111 or the heavily doped contact region 261 to the epitaxial pedestal 11, and then to the lower doped semiconductor portion 17, and then to the intrinsic semiconductor portion (i e, channel) 60, and into the upper doped semiconductor portion 63. The doped well region 111 and/or the heavily doped contact region 261, the epitaxial pedestal 11, and the lower doped semiconductor portion 17 can have a doping of the first conductivity type such that the dopant concentration in the epitaxial pedestal 11 is lower than the dopant concentration in the doped well region 111 or the heavily doped contact region 261, and/or is lower than the dopant concentration in the lower doped semiconductor region 17.

The lower doped semiconductor portion 17 can have a greater dopant concentration than the epitaxial pedestal 11 to provide Ohmic contact between the intrinsic semiconductor portion 60 and the epitaxial pedestal 11. The lower doped semiconductor portion 17 can be conductive, i.e., can be degenerately doped to have electrical conductivity greater than $1.0 \times 10^5$ S/cm. The epitaxial pedestal 11 can have a lesser dopant concentration than the lower doped semiconductor portion 17 and the doped semiconductor well 111 so that the epitaxial pedestal is semiconducting, i.e., have electrical conductivity in a range between $1.0 \times 10^{-6}$ S/cm to $1.0 \times 10^5$ S/cm, and the current flow through the epitaxial pedestal is controlled by the at least one electrically conductive layer 46A laterally surrounding the dielectric spacer 116 (unless the select gate electrode 46 is omitted). The doped semiconductor well 111 can have a greater dopant concentration than the epitaxial pedestal 11 to provide low electrical resistance. Because the doped semiconductor well 111 functions as a source line that provides electrical charge carriers of the first conductivity type for conduction of electrical current through the p-i-n junction structure (17, 60, 63), low resistance of the doped semiconductor well 111 can increase the on-current through the p-i-n junction structure (17, 60, 63).

Referring to FIG. 13A, an exemplary bias setting for hole current detection is illustrated for the case in which the first conductivity type is p-type and the second conductivity type is n-type. Programming and erasing of the memory elements in the memory stack structure 55 can be performed by inducing electron injection from the intrinsic semiconductor portion 60 into the memory elements in the memory film 50 through the electrical bias applied to appropriate electrically conductive layers (i.e., control gate electrodes) 46 via Fowler-Nordheim electron tunneling, hot electron injection and/or gate induced drain leakage (GIDL) where holes are created in the channel by a positive bias on control gate electrodes followed by applying a negative bias to the control gate electrodes to draw holes into the memory film to recombine with electrons trapped in the memory film to remove charge. Furthermore, electrons may be injected into the channel 60 from the upper doped semiconductor portion 63 (which functions as a drain region) during an inhibit operation.

During a read operation, the doped semiconductor well 111 can be electrically grounded, i.e., can be biased at 0 V. When a memory stack structure 55 is not selected for the read operation, a bias voltage of 0 V can be applied to the upper doped semiconductor portion 63 from a bit line (e.g., structure 98 or additional overlying line connected to structure 98). When a memory stack structure 55 is selected to read contents of the memory elements in the memory film 50, the upper doped semiconductor portion 63 can be electrically biased at a negative voltage with respect to a bias of the substrate, such as −5V from a bit line. The electrically conductive layers 46A, 46B, 46C employed as select gate electrodes (for example, the electrically conductive layers 46A laterally surrounding the dielectric spacer 116) can be electrically biased at a turn-on voltage such as −7 V, which turns on the epitaxial pedestal 11 for electrical conduction by holes. The unselected control gate electrodes (as embodied as electrically conductive layers 46U laterally surrounding the intrinsic semiconductor portion 60) are electrically biased at a negative (with respect to the bias of the substrate) turn-on voltage, such as −7V, which turns on the portions of the intrinsic semiconductor portion 60 at the level of the unselected control gate electrodes. The selected control gate electrode(s) 46S can be electrically biased at a select voltage, which can be 0 V. The Fermi energy for holes and the corresponding hole distribution are illustrated for the cases of electrically biasing the upper doped semiconductor portion 63 at 0 V and at −5 V in FIG. 13B.

The device of the first embodiment of the present disclosure employs the majority charge carriers of the doped well region 111, the epitaxial pedestal 11, and the lower doped semiconductor portion 17 as the charge carriers employed to conductive the predominant portion of electrical current through the intrinsic semiconductor portion 60 during the read operation. As such, there is no need to provide a doped region of a second conductivity type (such as a source region in prior art structures) near each set of the memory stack structure 55. Therefore, a large metal contact via structure filling a contact via cavity 79 is not necessary, and the contact via cavity 79 can be filled with a dielectric fill material portion 174. The trenches 79 containing the dielectric fill material portion 174 may be narrower than prior art trenches 79 since there is no source electrode/contact via structure located therein. This increases the active device area, decreases the manufacturing cost per string and avoid possible short circuits between the control gates 46 and the source electrode. Further, since a large metal contact via structure (e.g., tungsten structure) is not needed in proximity to each set of the memory stack structures 55 surrounded by the control gate "fingers", mechanical stress from a large metal contact via structure can be avoided in the first exemplary structure of the present disclosure. The decrease in stress decreases undesirable substrate warpage. Thus, the present disclosure provides a three-dimensional memory structure that has less mechanical stress than prior art structures employing a p-n-p transistor structure or an n-p-n transistor structure and uses one common well contact via structure 96 for plural sets of memory structures 55.

According to another aspect of the present disclosure, another method of removing a metal from a backside trench and employing majority charge carrier detection for sensing of stored electrical charges in memory cells is provided, which can be implemented employing a second exemplary structure or variants thereof. In this case, the vertical semiconductor channels are doped with electrical dopants of a first conductivity type, which has the same conductivity type as a semiconductor well or a semiconductor substrate (e.g., portion of source region) electrically connected to the vertical semiconductor channel. An upper doped semiconductor region (e.g., drain region) has a doping of a second conductivity type that is the opposite of the first conductivity type. Thus, a p-n junction is formed between the vertical semiconductor channel and the upper doped semiconductor region. However, a p-n junction is not formed between the source region and the vertical semiconductor channel.

In the second exemplary structure, majority charge carriers in the vertical semiconductor channel provide a predominant portion of the electrical current through the vertical semiconductor channel. In case the vertical semiconductor channel includes a p-doped semiconductor material, hole current detection is employed to sense the amount of stored electrical charges in memory cells. In case the vertical semiconductor channel includes an n-doped semiconductor material, electron current detection is employed to sense the amount of stored electrical charges in memory cells. Backside trenches employed to replace sacrificial material layers with electrically conductive layers can be filled with a material that provides low stress. For example, a dielectric material can be deposited in the backside trenches instead of a metallic material to reduce stress and warpage of a three-dimensional memory structure.

The inventors of the present disclosure realized that control of the height of the interface between the memory film 50 and underlying epitaxial semiconductor portion 18 can provide a stable yield level for the first exemplary structure. If the height of the interface between the memory film 50 and underlying epitaxial semiconductor portion 18 is too high, an electrical short between the epitaxial semiconductor portion 18 and electrically conductive layers 46 (which include source select gate electrodes around the epitaxial semiconductor portion 18) can depress the yield of the three-dimensional memory device of the first exemplary structure. If the height of the interface between the memory film 50 and underlying epitaxial semiconductor portion 18 is too low, reduction of the on-current due to weak electrical field at an elongated bottom portion of the semiconductor channel 60 can depress the yield of the three-dimensional memory device of the first exemplary structure. Thus, control of the height of the interface between the memory film 50 and underlying epitaxial semiconductor portion 18 within an optimal range is desired to maintain high yield of the first exemplary structure.

The second exemplary structure provides an enhanced process window for the height of the interface between the memory film 50 and underlying epitaxial semiconductor portion 18 by employing a doped semiconductor channel instead of an intrinsic semiconductor channel. The resistance of the semiconductor channel of the second exemplary structure is lower than the resistance of the semiconductor channel of the first exemplary structure. Consequently, the elongated bottom portion of the semiconductor channel of the second exemplary structure has a lower resistance, and reduction in the height of the epitaxial semiconductor portion 18 and accompanying increase in the elongated bottom portion of the semiconductor channel do not induce significant reduction in the on-current of the semiconductor channel. Therefore, even in the case of a lower height of the interface between the memory film 50 and underlying epitaxial semiconductor portion 18, degradation of the on-current of the semiconductor channel can be minimized, and the process window for the height of the interface between the memory film 50 and underlying epitaxial semiconductor portion 18 in the second exemplary structure can be increased over the corresponding process window for the first exemplary structure.

The second exemplary structure of the present disclosure can be derived from the first exemplary structure of FIG. 1. As in the first embodiment, at least one semiconductor device can be formed on a substrate semiconductor layer 9. A semiconductor material layer 10 including a single crystalline semiconductor material can be formed over the substrate semiconductor layer 9. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

A set of doped semiconductor material regions collectively extending continuously from underneath the top surface of the substrate (9, 10, 111) through the memory openings 49 to a level of the topmost layer of the alternating stack (32, 42) is formed in the second exemplary structure. The set of doped semiconductor material regions can include the doped semiconductor well 111 (which has a doping of the first conductivity type). In this case, the doped semiconductor well 111 can have a doping of the first conductivity type at a first dopant concentration.

The doped semiconductor well 111 is formed in an upper portion of the substrate (9, 10, 111 if present, 261 if present, 61 if present, 211 if present). If a semiconductor material layer 10 is present in an upper portion of the substrate (9, 10, 111 if present, 261 if present, 61 if present, 211 if present), the doped semiconductor well 111 can be formed in an upper portion of the semiconductor material layer 10. If the substrate does not include a semiconductor material layer and the topmost surface of the substrate is a surface of the substrate semiconductor layer 9, the doped semiconductor well 111 is formed in an upper portion of the substrate semiconductor layer 9.

The doped semiconductor well 111 can be formed by implantation or diffusion of electrical dopants of a first conductivity type (e.g., p-type or n-type, preferably p-type). The first conductivity type is the conductivity type of the topmost semiconductor layer in the substrate (9, 10, 111 if present, 261 if present, 61 if present, 211 if present). For example, if the substrate (9, 10, 111 if present, 261 if present, 61 if present, 211 if present) comprises the semiconductor material layer 10, the semiconductor material layer 10 and the doped semiconductor well 111 have a doping of the first conductivity type. If the topmost layer of the substrate is the substrate semiconductor layer 9 (i.e., the substrate does not include a semiconductor material layer), the substrate semiconductor layer 9 and the doped semiconductor well 111 have a doping of the first conductivity type. In other words, the doped semiconductor well 111 can be formed by implantation of electrical dopants of the same conductivity type as the doping of the topmost semiconductor material layer in the substrate (9, 10, 111 if present, 261 if present, 61 if present, 211 if present).

The doped semiconductor well 111 may be a lightly or heavily doped well. In one embodiment, the doped semiconductor well 111 may be a heavily doped well having a concentration of electrical dopants in a range from $1.0 \times 10^{18}/cm^3$ to $2.0 \times 10^{21}/cm^3$, although lesser and greater dopant concentrations can also be employed. In one embodiment, the concentration of electrical dopants of the first conductivity type (e.g., p-type) in the doped semiconductor well 111 can be in a range from $5.0 \times 10^{19}/cm^3$ to $2.0 \times 10^{21}/cm^3$. In one embodiment, the doped semiconductor well 111 can be conductive, i.e., can have electrical conductivity greater than $1.0 \times 10^5$ S/cm. The concentration of electrical dopants of the first conductivity type in the layer in which the doped semiconductor well 111 is located (which can be the semiconductor material layer 10 or the substrate semiconductor layer 9) can be in a range from $1.0 \times 10^{15}/cm^3$ to $1.0 \times 10^{18}/cm^3$. The layer can have a doping of the first conductivity type.

In case the doped semiconductor well 111 is not present, the set of doped semiconductor material regions includes the semiconductor material layer 10 that extends to the top surface of the substrate (9, 10). Each region within the set of doped semiconductor material regions has a doping of a first conductivity type.

As in the first embodiment, a dielectric pad layer 12 and/or a dielectric cap layer 31 can be formed on the top surface of the substrate (9, 10, 111). An alternating stack of first material layers (such as the insulating layers 32) and second material layers (such as the sacrificial material layers 42) can be formed over a substrate (9, 10, 111), which can include a substrate semiconductor layer 9, an optional semiconductor material layer 10, and an optional doped semiconductor well 111.

Memory openings 49 are formed through the alternating stack (32, 42) to a top surface of the substrate (9, 10, 111). The physically exposed surfaces of the substrate (9, 10, 111) at the bottom of each memory opening 49 can be surfaces of a semiconductor material portion having a doping of a first conductivity type, which can be p-type or n-type. For example, the physically exposed surfaces of the substrate (9, 10, 111) at the bottom of each memory opening 49 can be semiconductor surfaces of the doped semiconductor well 111 or of the semiconductor material layer 10. In one embodiment, the first conductivity type can be p-type.

Referring to FIG. 14A, an epitaxial pedestal 11 can be formed at the bottom portion of each memory opening 49, for example, by selective epitaxy. The epitaxial pedestal 11 is formed at a bottom of the memory opening 49 by depositing a single crystalline semiconductor material on the physically exposed surface of the substrate (9, 10, 111) employing a selective epitaxial deposition process. The physically exposed surface of the substrate (9, 10, 111) can comprise a recessed top surface and sidewalls of the doped semiconductor well 111. The epitaxial pedestal 11 comprises a single crystalline semiconductor material in epitaxial alignment with the single crystalline semiconductor material of the doped semiconductor well 111. In one embodiment, the epitaxial pedestal 11 can be doped with electrical dopants of the same conductivity type as the doped semiconductor well 111. In one embodiment, the doped semiconductor well 111 can have a doping of the first conductivity type at a first dopant concentration, and the epitaxial pedestal 11 can be formed directly on the doped semiconductor well 111 with a doping of the first conductivity type at a second dopant concentration that is less than the first dopant concentration. In one embodiment, the epitaxial pedestal 11 may be lightly doped (e.g., p-doped) having a concentration of electrical dopants of the first conductivity type in range from $1.0 \times 10^{15}/cm^3$ to $1.0 \times 10^{18}/cm^3$.

In one embodiment, the top surface of each epitaxial pedestal 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial pedestals 11 with a respective conductive material layer. The top surface of each epitaxial pedestal 11 can be directly adjoined to a respective sidewall of an insulating layer 32, which may have a greater thickness than overlying insulating layers 32. The vertical distance d between a horizontal plane including the top surfaces of the epitaxial pedestals 11 and a horizontal plane including an interface between the insulating layer adjoined to the top surfaces of the epitaxial pedestals 11 and an overlying sacrificial material layer 42 can be greater than the corresponding vertical distance of the first exemplary structure.

For example, the vertical distance d can be in a range from 10% to 90% of the thickness of the insulating layer located at the level of the top surfaces of the epitaxial pedestals 11. In one embodiment, the vertical distance d can be in a range from 20% to 80%, such as from 30% to 70%, of the thickness of the insulating layer located at the level of the top surfaces of the epitaxial pedestals 11. In one embodiment, the thickness of the insulating layer 32 at the level of the top surfaces of the epitaxial pedestal 11 can be in a range from 20 nm to 60 nm, such as from 30 nm to 50 nm, although lesser and greater thicknesses can also be employed.

Referring to FIG. 14B, electrical dopants of the first conductivity type can be doped (e.g., implanted or diffused) into an upper region of the epitaxial pedestal 11. The implanted region of the epitaxial pedestal 11 is herein referred to as a lower doped semiconductor portion 17. The epitaxial pedestal 11 comprises deposited single crystalline semiconductor material. Thus, a portion of the epitaxial pedestal 11 is converted into the lower doped semiconductor portion 17 by implanting electrical dopants of the first conductivity type into an upper portion of the deposited single crystalline semiconductor material. The remaining portion of the epitaxial portion 11 has a doping of the first conductivity type at a lower dopant concentration than the lower doped semiconductor portion 17, which has a doping of the first conductivity type. The lower doped semiconductor portion 17 may be heavily doped (e.g., p+ doped) and a concentration of electrical dopants of the first conductivity type in the lower doped semiconductor portion 17 can be a range from $1.0 \times 10^{15}/cm^3$ to $1.0 \times 10^{18}/cm^3$.

The energy of the ion implantation can be selected such that the top surface and the bottom surface of the lower doped semiconductor portion 17 can be located between a first horizontal plane including a top surface of an insulator layer 32 and a second horizontal plane including a bottom surface of the insulator layer 32. Thus, the lower doped semiconductor portion 17 is formed at a lower portion of the memory opening 49. Because the electrical dopants of the first conductivity type are not implanted into a lower portion of the epitaxial pedestal 11 during formation of the lower doped semiconductor portion 17, the lower portion of the epitaxial pedestal 11 that is not converted into the lower doped semiconductor portion 17 remains lightly doped and has a doping of the first conductivity type at a lower dopant concentration than the lower doped semiconductor portion 17 after formation of the lower doped semiconductor portion 17. Alternatively, the lower doped semiconductor portion 17 is doped in-situ during growth. Each vertically neighboring pair of an epitaxial pedestal 11 and a lower doped semiconductor portion 17 is collectively referred to as an epitaxial semiconductor portion 18. The epitaxial semiconductor portion 18 is an element of the set of doped semiconductor material regions each having a doping of the first conductivity type and, upon formation of remaining elements therein in subsequent processing steps, collectively extending continuously from underneath the top surface of the substrate (9, 10, 111) through the memory opening to a level of a topmost layer of the alternating stack (32, 42). The lower doped semiconductor portion 17 or the entire epitaxial semiconductor portion 18 functions as source region of the device which has the same conductivity type as the channel region and opposite conductivity type as the drain region (e.g., region 63 described below).

Referring to FIG. 14C, a series of layers including at least one blocking dielectric layer (501L, 503L), a memory material layer 504L, a tunneling dielectric layer 506L, and an optional first semiconductor channel layer 901L can be sequentially deposited in the memory openings 49 as in the processing steps of FIG. 2C. The at least one blocking dielectric layer (501L, 503L) can include, for example, a first blocking dielectric layer 501L and a second blocking dielectric layer 503L.

The first blocking dielectric layer 501L and the second blocking dielectric layer 503L can be the same as in the first embodiment, and can be deposited by the same deposition methods. The memory material layer 504L and the tunneling dielectric layer 506L can be the same as in the first embodiment, and can be deposited by the same deposition methods.

The optional first semiconductor channel layer 901L including a semiconductor material can be formed. The first semiconductor channel layer 901L can include a doped semiconductor material having a doping of the first conductivity type, or can include an intrinsic semiconductor material. In one embodiment, the first semiconductor channel layer 901L can include a doped semiconductor material having a doping in a range from $1.0 \times 10^{15}/cm^3$ to $1.0 \times 10^{18}/cm^3$, such as from $1.0 \times 10^{15}/cm^3$ to $1.0 \times 10^{17}/cm^3$. If the first semiconductor channel layer 901L includes an intrinsic semiconductor material as deposited, dopants of the first conductivity type in a second semiconductor channel layer to be subsequently deposited can diffuse into the first semiconductor channel layer 901L in a subsequent anneal process to convert intrinsic semiconductor material of the first semiconductor channel layer 901L into a doped semiconductor material having a doping of the first conductivity type.

The first semiconductor channel layer 901L includes can comprise at least one elemental semiconductor material, at least one III-V compound semiconductor material, at least one II-VI compound semiconductor material, at least one organic semiconductor material, or other semiconductor materials known in the art. In one embodiment, the first semiconductor channel layer 901L includes amorphous silicon or polysilicon. If deposited as an amorphous material, the material of the first semiconductor channel layer 901L is annealed to become a polycrystalline semiconductor material in a subsequent anneal process. The first semiconductor channel layer 901L can be formed by a conformal deposition method such as low pressure chemical vapor deposition (LPCVD). The thickness of the first semiconductor channel layer 901L can be in a range from 2 nm to 10 nm, although lesser and greater thicknesses can also be employed. A cavity 49' is formed in the volume of each memory opening 49 that is not filled with the deposited material layers (501L, 503L, 504L, 506L, 901L).

Referring to FIG. 14D, the optional first semiconductor channel layer 901L, the tunneling dielectric layer 506L, the memory material layer 504L, the at least one blocking dielectric layer (501L, 503L) are sequentially anisotropically etched employing at least one anisotropic etch process. The portions of the first semiconductor channel layer 901L, the tunneling dielectric layer 506L, the memory material layer 504L, and the at least one blocking dielectric layer (501L, 503L) located above the top surface of the insulating cap layer 70 can be removed by the at least one anisotropic etch process. Further, the horizontal portions of the first semiconductor channel layer 901L, the tunneling dielectric layer 506L, the memory material layer 504L, and the at least one blocking dielectric layer (501L, 503L) at a bottom of each cavity 49' can be removed to form openings in remaining portions thereof. Each of the first semiconductor channel layer 901L, the tunneling dielectric layer 506L, the memory material layer 504L, and the at least one blocking dielectric layer (501L, 503L) can be etched by anisotropic etch process.

Each remaining portion of the first semiconductor channel layer 901L constitutes a first semiconductor channel portion 901. Each remaining portion of the tunneling dielectric layer 506L constitutes a tunneling dielectric 506. Each remaining portion of the memory material layer 504L is herein referred to as a charge storage element 504. In one embodiment, the charge storage element 504 can be a continuous layer, i.e., can be a charge storage layer. Each remaining portion of the second blocking dielectric layer 503L is herein referred to as a second blocking dielectric 503. Each remaining portion of the first blocking dielectric layer 501L is herein referred to as a first blocking dielectric 501. A surface of the epitaxial pedestal 11 can be physically exposed underneath the opening through the first semiconductor channel portion 901, the tunneling dielectric 506, the charge storage element 504, and the at least one blocking dielectric (501, 503). Optionally, the physically exposed portion of the epitaxial pedestal 11 can be vertically recessed. A tunneling dielectric 506 is surrounded by a charge storage element 504. The charge storage element 504 can comprise a charge trapping material or a floating gate material.

The set of the tunneling dielectric 506, the charge storage element 504, the second blocking dielectric 503, and the first blocking dielectric 501 collectively constitutes a memory film 50. In one embodiment, the first semiconductor channel portion 901, the tunneling dielectric 506, the charge storage element 504, the second blocking dielectric 503, and the first blocking dielectric 501 can have vertically coincident sidewalls.

Referring to FIG. 14E, a second semiconductor channel layer 902L can be deposited directly on the semiconductor surface of the lower doped semiconductor portion 17 over the substrate (9, 10), and directly on the first semiconductor channel portion 901. The second semiconductor channel layer 902L includes a doped semiconductor material having a doping of the first conductivity type.

In one embodiment, the second semiconductor channel layer 902L can include a doped semiconductor material having a doping in a range from $1.0 \times 10^{15}/cm^3$ to $1.0 \times 10^{18}/cm^3$, such as from $1.0 \times 10^{15}/cm^3$ to $1.0 \times 10^{17}/cm^3$. The second semiconductor channel layer 902L includes can comprise at least one elemental semiconductor material, at least one III-V compound semiconductor material, at least one II-VI compound semiconductor material, at least one organic semiconductor material, or other semiconductor materials known in the art. In one embodiment, the second semiconductor channel layer 902L includes amorphous silicon or polysilicon. If deposited as an amorphous material, the material of the second semiconductor channel layer 902L is annealed to become a polycrystalline semiconductor material in a subsequent anneal process.

The second semiconductor channel layer 902L can be formed by a conformal deposition method such as low pressure chemical vapor deposition (LPCVD). The thickness of the second semiconductor channel layer 902L can be in a range from 2 nm to 10 nm, although lesser and greater thicknesses can also be employed. The second semiconductor channel layer 902L may partially fill the cavity 49' in each memory opening, or may fully fill the cavity in each memory opening.

The materials of the first semiconductor channel portion 901 and the second semiconductor channel layer 902L are collectively referred to as a semiconductor channel material.

In other words, the semiconductor channel material is a set of all semiconductor material in the first semiconductor channel portion 901 and the second semiconductor channel layer 902L.

Referring to FIG. 14F, in case the cavity 49' in each memory opening is not completely filled by the second semiconductor channel layer 902L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 14G, the horizontal portion of the dielectric core layer 62L can be removed, for example, by a recess etch from above the top surface of the insulating cap layer 70. Further, the horizontal portion of the second semiconductor channel layer 902L located above the top surface of the insulating cap layer 70 can be removed by a planarization process, which can employ a recess etch or chemical mechanical planarization (CMP). Each remaining portion of the second semiconductor channel layer 902L within a memory opening constitutes a second semiconductor channel portion 902.

Each adjoining pair of a first semiconductor channel portion 901 and a second semiconductor channel portion 902 can collectively form a doped semiconductor channel 90 through which electrical current can flow when a vertical NAND device including the doped semiconductor channel 90 is turned on. The doped semiconductor channel 90 is an element of the set of doped semiconductor material regions (111, 18, 90) each having a doping of the first conductivity type and collectively extending continuously from underneath the top surface of the substrate (9, 10, 111) through the memory film 50 to a level of a topmost layer of the alternating stack (32, 42). The doped semiconductor channel 90 is formed after formation of the memory film 50.

A tunneling dielectric 506 is surrounded by a charge storage element 504, and laterally surrounds a portion of the doped semiconductor channel 90. Each adjoining set of a first blocking dielectric 501, a second blocking dielectric 503, a charge storage element 504, and a tunneling dielectric 506 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Referring to FIG. 14H, an upper doped semiconductor portion 63 (e.g., drain region) can be formed by depositing a doped semiconductor material having a doping of a second conductivity type (e.g., n-type) within each recessed region above the dielectric cores 62. The second conductivity type is the opposite of the first conductivity type. The upper doped semiconductor portion 63 may be heavily doped (e.g., n+ doped) and a concentration of dopants of the second conductivity type within the upper doped semiconductor portion 63 can be in a range from $1.0\times10^{18}/cm^3$ to $2.0\times10^{21}/cm^3$, although lesser and greater concentrations of the dopants of the second conductivity type can also be employed. Thus, one of the first and second conductivity types is p-type and another of the first and second conductivity types is n-type. In one embodiment, the first conductivity type is p-type, and the second conductivity type is n-type. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the upper doped semiconductor portions 63.

A p-n junction structure is formed by the combination of the doped semiconductor channel 90 having a doping of the first conductivity type (which may comprise first and second semiconductor channel portions (901, 902)) and the upper doped semiconductor portion 63 having a doping of the second conductivity type. The p-n junction structure (90, 63) vertically extends through the stack of alternating layers (32, 42) substantially perpendicular (e.g., between 0 and 10 degrees) with respect to the top surface (7, 7A) of the substrate (9, 10). Thus, a p-n junction is formed between the doped semiconductor channel 90 and the upper doped semiconductor portion 63. Each epitaxial semiconductor portion 18 can function similar to a source, the doped semiconductor channel 90 can function similar to a channel, and an upper doped semiconductor portion 63 functions similar to a drain of a NAND string, even though they form a multi-gated, vertical p-n diode structure rather than a typical n-i-n or p-i-p structure of a NAND multi-gate transistor. There is no p-n, p-i or n-i junction between the doped semiconductor channel 90 and the source region (e.g., 18).

A memory stack structure 55 is formed within each memory opening 49. Each memory stack structure comprises an epitaxial pedestal 11, a lower doped semiconductor portion 17, a memory film 50, and a doped semiconductor channel 90. A combination of an adjoining pair of an epitaxial pedestal 11 and a lower doped semiconductor portion 17 constitutes an epitaxial semiconductor portion 18.

An instance of the exemplary memory stack structure illustrated in FIG. 14H can be formed within each instance of a memory opening 49 as illustrated in FIG. 1. At this processing step, the second exemplary structure includes a semiconductor device, which comprises a stack (32, 42) including an alternating plurality of material layers (e.g., the sacrificial material layers 42) and insulating layers 32 located over a semiconductor substrate (9, 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate.

The processing steps of FIG. 4 can be subsequently performed to form an optional first contact level dielectric layer 71 over the substrate (9, 10). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

As in the first embodiment, a portion of the alternating stack (32, 42) can be removed, for example, by applying and patterning a photoresist layer with an opening and by transferring the pattern of the opening through the alternating stack (32, 42) employing an etch such as an anisotropic etch. A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). A retro-stepped dielectric material portion 65 (i.e., an insulating fill material portion) can be formed in the stepped cavity by deposition of a dielectric material therein in the same manner as in the first embodiment. Alternatively, formation of the stepped surfaces and the retro-stepped dielectric material portion 65 can be performed prior to formation of the memory stack structures 55.

The processing steps of FIGS. 5A and 5B can be subsequently performed to form at least one dielectric support pillar 7P through the retro-stepped dielectric material portion 65 and/or through the first contact level dielectric layer 71 and/or through the alternating stack (32, 42). In one embodiment, the portion of the dielectric material that is deposited over the first contact level dielectric layer 71 concurrently with deposition of the at least one dielectric support pillar 7P can be present over the first contact level dielectric layer 71 as a second contact level dielectric layer 73. Each of the at least one dielectric support pillar 7P and the second contact level dielectric layer 73 is an optional structure. In one embodiment, the second contact level dielectric layer 73 and the at least one dielectric support pillar 7P can be formed as a single continuous structure of integral construction, i.e., without any material interface therebetween. In another embodiment, the portion of the dielectric material that is deposited over the first contact level dielectric layer 71 concurrently with deposition of the at least one dielectric support pillar 7P can be removed, for example, by chemical mechanical planarization or a recess etch. In this case, the second contact level dielectric layer 73 is not present, and the top surface of the first contact level dielectric layer 71 can be physically exposed. Optionally, memory contact via structures 88 can be formed through the first and second contact level dielectric layers (73, 71). Alternatively, a dummy memory stack structure may be used as a support pillar. A dummy memory stack structure is formed at the same time as the memory stack structures 55, but they are not electrically connected to bit lines.

The processing steps of FIG. 6 can be subsequently performed. Specifically, an etchant that selectively etches the second material of the sacrificial material layers 42 with respect to the first material of the insulating layers 32 can be introduced into the at least one backside trench 79, for example, employing an etch process. Backside recesses 43 are formed in volumes from which the sacrificial material layers 42 are removed.

The processing steps of FIG. 7 can be subsequently performed. For example, a backside blocking dielectric layer 66 can be optionally formed. The backside blocking dielectric layer 66 comprises a dielectric material that functions as a control gate dielectric for the control gates to be subsequently formed in the backside recesses 43. In case the at least one blocking dielectric layer (501, 503) is present within each memory opening, the backside blocking dielectric layer 66 is optional. In case the at least one blocking dielectric layer (501, 503) is omitted, the backside blocking dielectric layer 66 is present.

The processing steps of FIG. 8 can be subsequently performed. At least one metallic material can be deposited in the plurality of backside recesses 43, on the sidewalls of the at least one the backside contact trench 79, and over the top surface of the second contact level dielectric layer 73. As used herein, a metallic material refers to an electrically conductive material that includes at least one metallic element. A plurality of electrically conductive layers 46 can be formed in the plurality of backside recesses 43, and a continuous metallic material layer 46L can be formed on the sidewalls of each backside contact trench 79 and over the at least one contact level dielectric layer (71,73). Thus, each sacrificial material layer 42 can be replaced with an electrically conductive layer 46. A backside cavity 79' is present in the portion of each backside contact trench 79 that is not filled with the backside blocking dielectric layer 66 and the continuous metallic material layer 46L. A dielectric spacer 116 laterally surrounds a semiconductor portion that underlies the lower doped semiconductor portion, wherein one of the electrically conductive layers laterally surrounds the dielectric spacer upon formation of the electrically conductive layers.

The processing steps of FIG. 9 can be subsequently performed. The deposited metallic material of the continuous metallic material layer 46L is etched back from the sidewalls of each backside contact trench 79 and from above the second contact level dielectric layer 73, for example, by an isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

A cavity is present in the backside contact trench 79 after removal of the conductive material from inside the backside contact trench 79. A trench fill dielectric material is deposited in the cavity to fill the entire volume of the cavity. A trench fill dielectric material portion 174 is formed in the backside contact trench 79. The portion of the deposited trench fill dielectric material over a horizontal plane including the topmost surface of the backside blocking dielectric layer 66 (or a horizontal plane including a topmost dielectric material layer in the second exemplary structure in case a horizontal portion of the backside blocking dielectric layer 66 is not present over the second contact level dielectric layer 73) constitutes a dielectric material layer, which is herein referred to as a first interconnect dielectric material layer 74L. The dielectric material of the trench fill dielectric material portion 174 and the first interconnect dielectric material layer 74L can comprise silicon oxide, organosilicate glass, silicon nitride, a dielectric metal oxide, or a combination thereof. The trench fill dielectric material portion 174 may be optionally removed above layer 73 as shown in FIG. 12A and described below. Thus, there is no source electrode or electrical contact structure in the trenches 79 which horizontally separate adjacent elongated control gate electrodes 46 in the stack.

The processing steps of FIG. 10 can be subsequently performed. A second interconnect dielectric material layer 92 can be optionally deposited over the first interconnect dielectric material layer 74L. The second interconnect dielectric material layer 92 includes an interlayer dielectric for an interconnect level, which can be, for example, silicon oxide, porous or non-porous organosilicate glass, silicon nitride, a dielectric metal oxide, or a combination thereof. The second interconnect dielectric material layer 92 can be formed, for example, by chemical vapor deposition. The first and second interconnect dielectric material layers (74L, 92) can be employed as dielectric interlay in which metal interconnect structures can be formed.

A photoresist layer (not shown) can be applied over the topmost layer of the second exemplary structure (which can be, for example, the second interconnect dielectric material layer 92), and can be lithographically patterned to form various openings. The locations and the shapes of the openings in the peripheral device region 200 can be selected to correspond to electrical nodes of the semiconductor devices in the peripheral device region 200 to be electrically contacted by contact via structures. The locations of the openings within the contact region 300 correspond to areas in which formation of contact via structures for the electrically conductive layers 46 is desired. The locations of the openings within the memory device region 100 can be selected to overlie the memory contact via structures 88 (or upper doped semiconductor portions 63 if the memory contact via structures 88 are formed in a later step).

An anisotropic etch is performed to etch through the various layers overlying the electrical nodes of the semiconductor devices in the peripheral device region 200, the various layers overlying the stepped surfaces at the interface between the alternating stack (32, 46) and the retro-stepped dielectric material portion 65 in the contact region 300, and the various layers overlying the memory contact via structures in the memory device region 100 to form via cavities (i.e., openings).

In the peripheral device region 100, at least one gate via cavity 7G can be formed such that the bottom surface of each gate via cavity is a surface of a gate electrode (152, 154), and at least one active region via cavity 7A can be formed such that the bottom surface of each active region via cavity is a surface of an active region 130. Control gate contact via cavities (not shown) can be formed through the retro-stepped dielectric material portion 65 by transfer of the pattern of the opening by an anisotropic etch. Each control gate contact via cavity can vertically extend to a top surface of a respective electrically conductive layer 46. The control gate contact via cavities can extend to horizontal surfaces within the stepped interface between the retro-stepped dielectric material portion 65 and the alternating stack of the insulator layers 32 and the electrically conductive layers 46. Array contact via cavities (i.e., openings) 97 overlying the memory contact via structures 88 (or upper doped semiconductor portions 63 if structures 88 are formed in a later step) can be formed in the memory device region 100. The well contact via cavity 95 may be formed in any suitable region, such as region 300 to the doped semiconductor well 111. If desired, a heavily doped contact region 261 may be formed in the doped semiconductor well 111 through the cavity 95 by ion implantation or diffusion. The heavily doped contact region 261 may be heavily doped with dopants of the first conductivity type (e.g., p+ doped). The photoresist layer can be subsequently removed, for example, by ashing.

Figure 15:
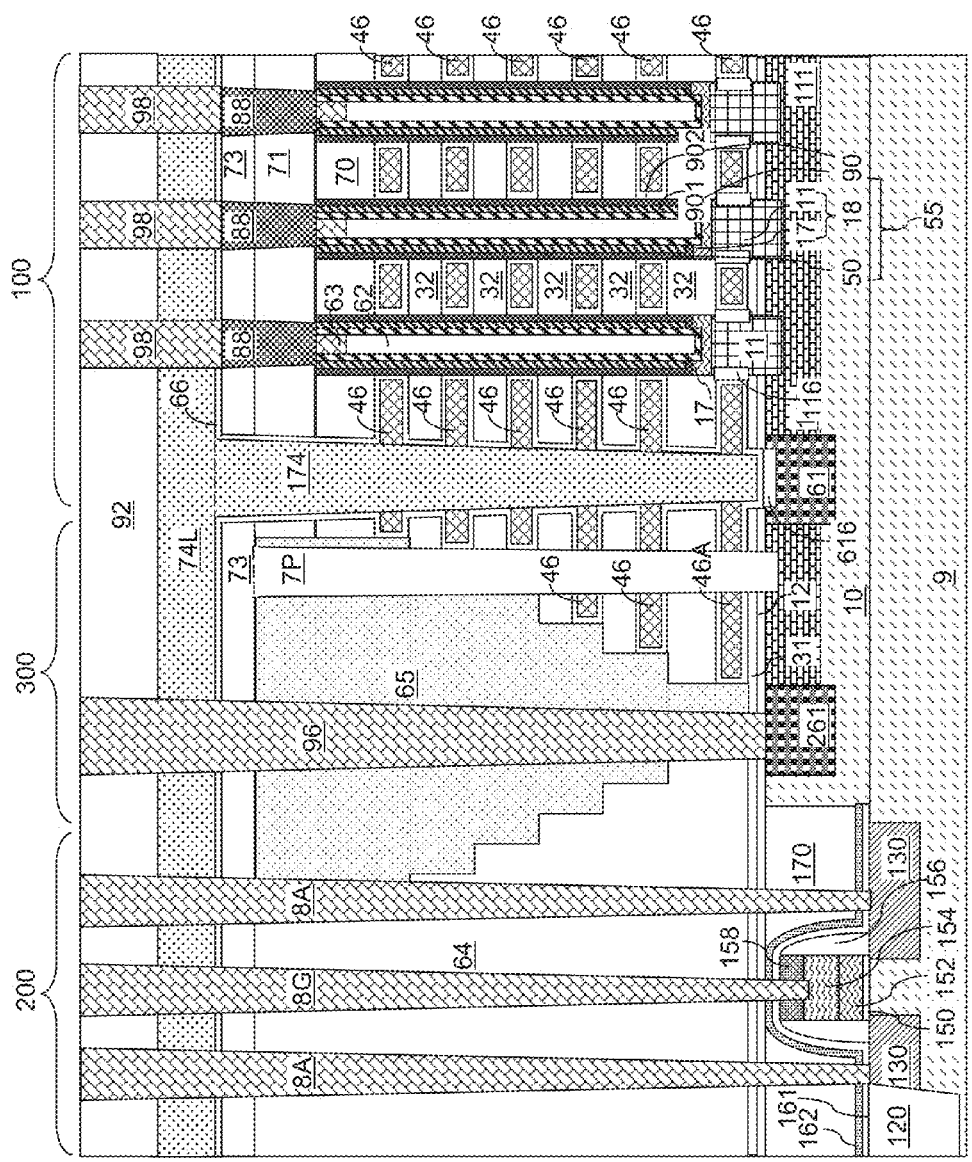
FIG. 15 is a vertical cross-sectional view of a second exemplary structure after formation of various contact via structures according to the second embodiment of the present disclosure.

Referring to FIG. 15, the various via cavities (7A, 7G, 95, 97) can be filled with a conductive material to form various contact via structures (8G, 8A, 96, 98). The contact via structures (8G, 8A, 96, 98) can include for example, at least one gate contact via structure 8G and at least one active region contact via structure 8A that are formed in the peripheral device region 200 in via cavities 7G and 7A, respectively, well contact via structure 95 in the well contact via cavity 95, array contact via structures 98 in the via cavities 97 in memory device region 100, and control gate contact via structures (not shown) that are formed in the contact region 300. The at least one gate contact via structure 8G and the at least one active region contact via structure 8A in the peripheral device region 200 provide electrical contact to various nodes of the peripheral devices in the peripheral device region 200. The well contact via structure 96 contacts the doped semiconductor well 111 or the heavily doped contact region 261 in the doped semiconductor well 111. The array contact via structures 98 in the memory device region 100 can contact the memory contact via structures 88 or contact the upper doped semiconductor portion 63 if structures 88 are omitted. The control gate contact via structures in the contact region 300 can provide electrical contact to the electrically conductive layers 46.

For each memory film 50 in a respective memory opening 49, a set of doped semiconductor material regions (261 (if present), 61 (if present), 111, 18, 90) collectively extends continuously from underneath the top surface of the substrate (9, 10, 111, 261, 61) through the memory film 50 to a level of a topmost layer of the alternating stack (32, 46). Each element in the set of doped semiconductor material regions (261 (if present), 61 (if present), 111, 18, 90) has a doping of the first conductivity type. The set of doped semiconductor material regions (261 (if present), 61 (if present), 111, 18, 90) includes a doped contact region (as embodied as one of the heavily doped contact region 261 or as a portion of the doped semiconductor well 111 in case a heavily doped contact region 261 is not present) underlying the top surface of the substrate (9, 10, 111, 261, 61) and a doped semiconductor channel 90 extending through the memory opening. The well contact via structure 96 can extend through each level of the alternating stack (32, 46), and can be formed directly on the doped contact region (which may be the heavily doped contact region 261 or the doped semiconductor well 111). If the heavily doped contact region 261 is provided, the heavily doped contact region 261 can include a conductive semiconductor material having electrical conductivity greater than $1.0 \times 10^5$ S/cm. The set of doped semiconductor material regions (261 (if present), 61 (if present), 111, 18, 90) includes a continuous top surface of the substrate (9, 10, 111, 261, 61) that extends between the well contact via structure 96 and each of the epitaxial semiconductor portions 18, which can include top surfaces of the heavily doped contact region 261, the optional bridging region 61, and the doped semiconductor well 111.

Figure 16:
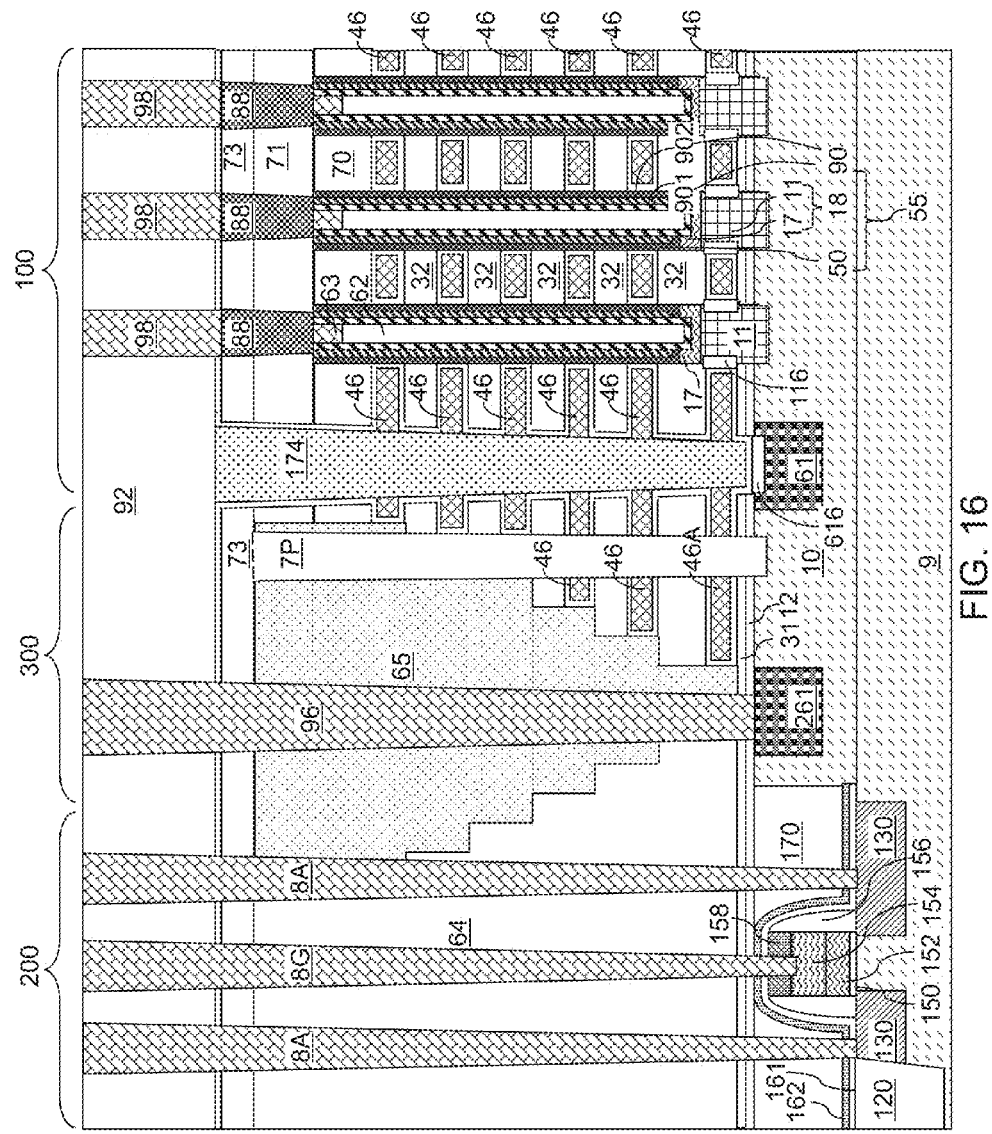
FIG. 16 is a vertical cross-sectional view of a first alternate embodiment of the second exemplary structure according to the second embodiment of the present disclosure.

Referring to FIG. 16, a first alternate embodiment of the second exemplary structure is shown, which can be derived from the second exemplary structure of FIG. 15 by removing the first interconnect dielectric layer 74L by a planarization process. For example, the first interconnect dielectric layer 74L can be removed by a recess etch or chemical mechanical planarization. In this case, the second interconnect dielectric layer 92 can be formed directly on the top surface of the backside blocking dielectric layer 66, the second contact level dielectric layer 73, or the first contact level dielectric layer 71. Thus, the trench fill dielectric material portion 174 does not extend above layer 73.

Optionally, the doped semiconductor well 111 may be omitted, as shown in FIG. 16. In this embodiment, the semiconductor material layer 10 acts as the horizontal part of the "source" or "channel" through which a read hole current flows between a well contact via structure 96 and array contact via structures 98 (i.e., between the heavily doped contact region 261 and the upper doped semiconductor portion 63). In this embodiment, the semiconductor material layer 10 has a doping of the first conductivity type, and is an element of a set of doped semiconductor material regions (261 (if present), 61 (if present), 10, 18, 90) collectively extends continuously from underneath the top surface of the substrate (9, 10, 261, 61) through the memory film 50 to a level of a topmost layer of the alternating stack (32, 46). Each element in the set of doped semiconductor material regions (261 (if present), 61 (if present), 10, 18, 90) has a doping of the first conductivity type. The optional bridging region 61 facilitates hole flow below the trench fill dielectric material portion 174. The set of doped semiconductor material regions (261 (if present), 61 (if present), 10, 18, 90) includes a continuous top surface of the substrate (9, 10, 261, 61) that extends between the well contact via structure 96 and each of the epitaxial semiconductor portions 18, which can include top surfaces of the heavily doped contact region 261, the optional bridging region 61, and the semiconductor material layer 10.

Figure 17:
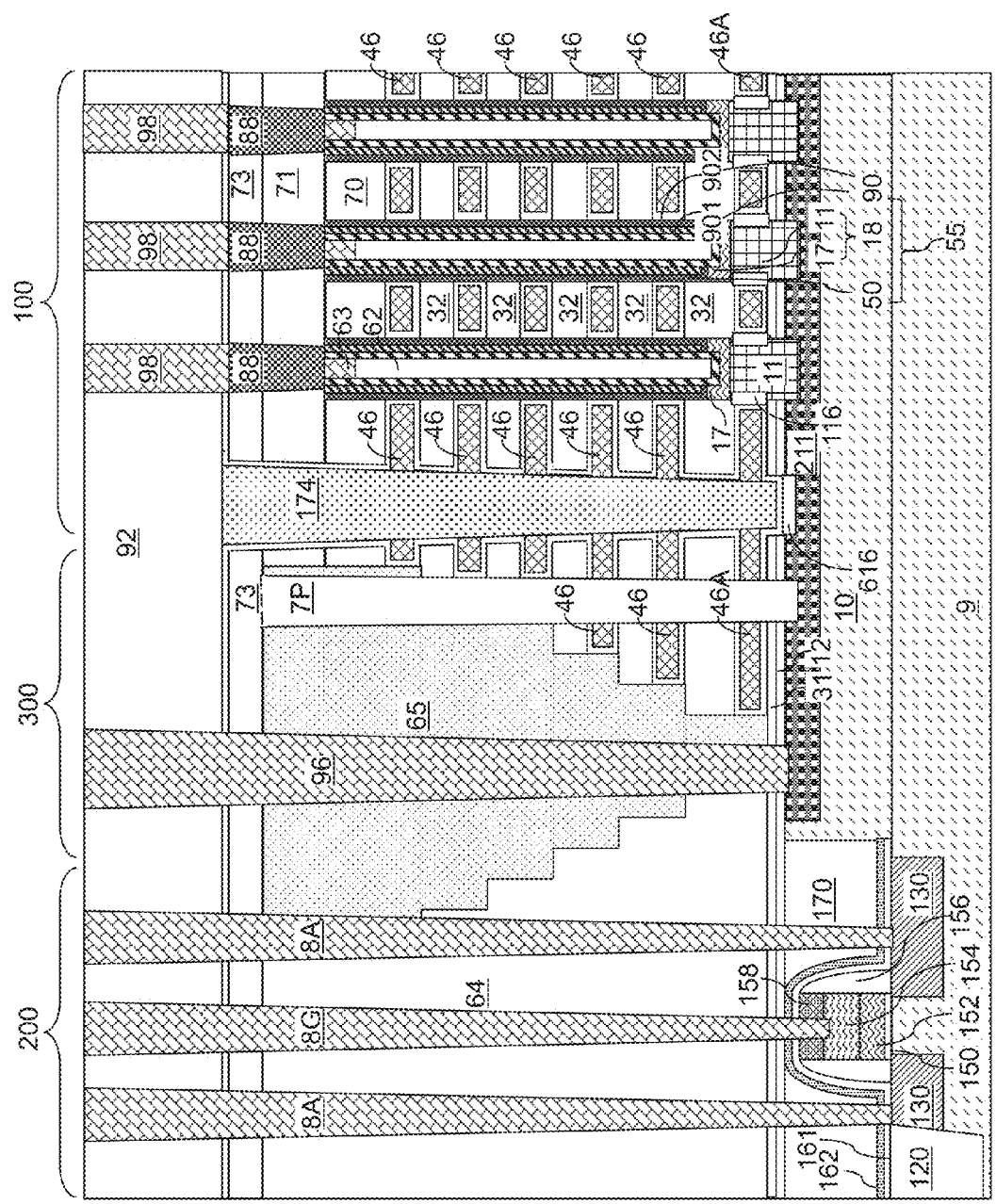
FIG. 17 is a vertical cross-sectional view of a second alternate embodiment of the second exemplary structure according to the second embodiment of the present disclosure.

Referring to FIG. 17, a second alternate embodiment of the second exemplary structure is shown. In this embodiment, the discrete bridging region 61 and/or the heavily doped contact region 261 may be omitted and replaced by an elongated heavily doped semiconductor region 211 of the first conductivity type (e.g., p+ well). The heavily doped semiconductor region extends between the well contact via structure 96 and the epitaxial pedestals 11.

For each memory film 50 in a respective memory opening 49, a set of doped semiconductor material regions (211, 18, 90) collectively extends continuously from underneath the top surface of the substrate (9, 10, 211) through the memory film 50 to a level of a topmost layer of the alternating stack (32, 46). Each element in the set of doped semiconductor material regions (211, 18, 90) has a doping of the first conductivity type. The set of doped semiconductor material regions (211, 18, 90) includes a doped contact region (as embodied as the elongated heavily doped semiconductor region 211) underlying the top surface of the substrate (9, 10, 211) and a doped semiconductor channel 90 extending through the memory opening. The well contact via structure 96 can extend through each level of the alternating stack (32, 46), and can be formed directly on the doped contact region (i.e., the elongated heavily doped semiconductor region 211). The elongated heavily doped semiconductor region 211 can include a conductive semiconductor material having electrical conductivity greater than $1.0 \times 10^5$ S/cm. The set of doped semiconductor material regions (211, 18, 90) includes a continuous top surface of the substrate (9, 10, 211) that extends between the well contact via structure 96 and each of the epitaxial semiconductor portions 18, which can include the top surface of the elongated heavily doped semiconductor region 211.

Figure 18:
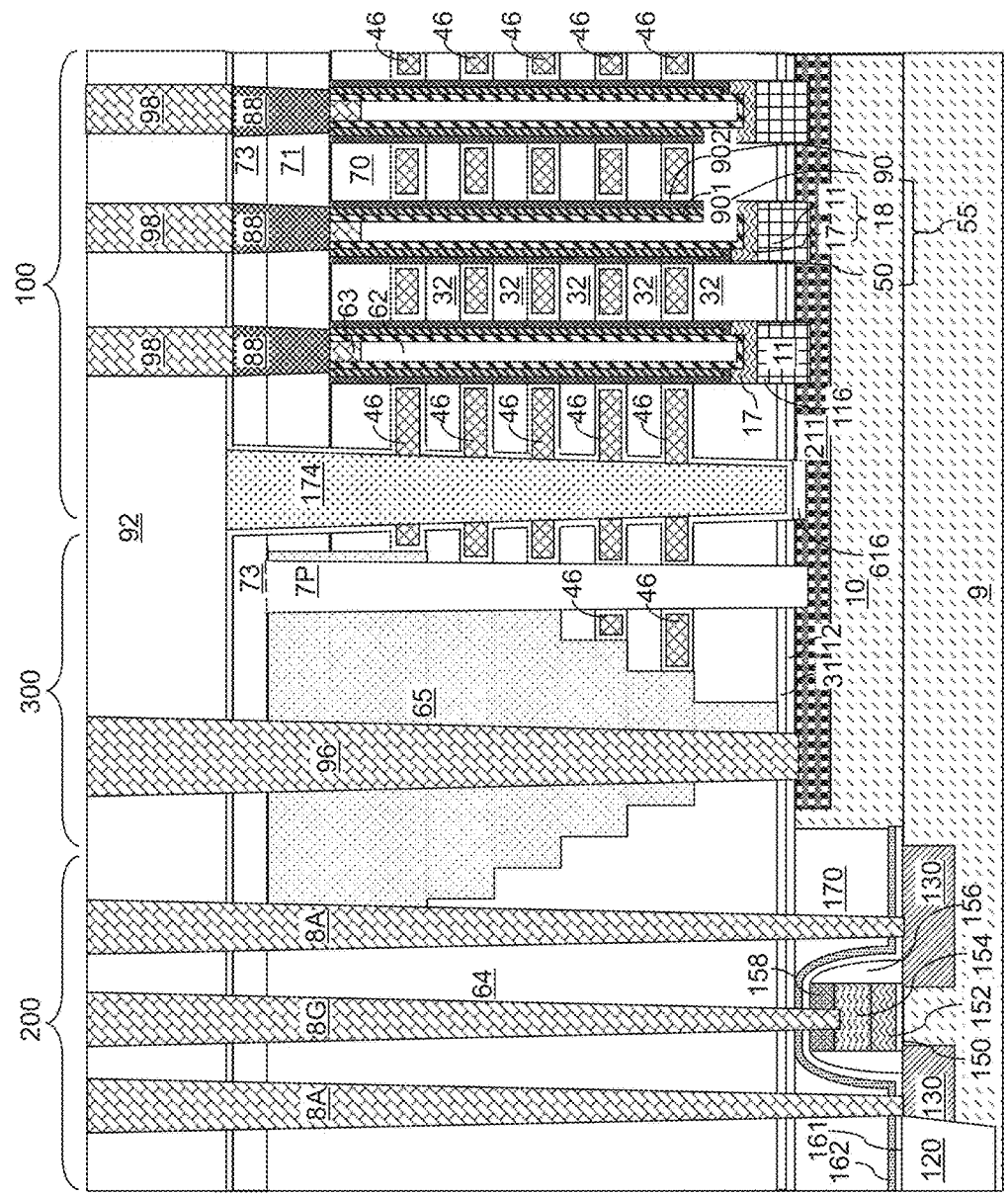
FIG. 18 is a vertical cross-sectional view of a third alternate embodiment of the second exemplary structure according to the second embodiment of the present disclosure.

Referring to FIG. 18, a third alternate embodiment of the second exemplary structure is shown, which can be derived from the second exemplary structure of FIG. 15 or the alternate embodiments of the second exemplary structure of FIGS. 16 and 17 by omitting one or more lower select gate electrodes, such as the bottom select gate electrode 46A shown in FIGS. 15-17. Electrode 46A may be omitted because it is not required to create a depletion region for electron transport through layer 10 in case a hole read current flow through the doped semiconductor well 111, the elongated heavily doped semiconductor region 211, or the semiconductor material layer 10 is used during the read operation of the NAND strings.

The second exemplary structure, or various alternate embodiments thereof, can comprise a monolithic three-dimensional memory device. The monolithic three-dimensional memory device can comprise an alternating stack (32, 46) of insulating layers 32 and electrically conductive layers 46 located over a substrate (9, 10, 111 if present, 261 if present, 61 if present, 211 if present); a memory opening 49 extending through the alternating stack (32, 46) and at least to a top surface of the substrate (9, 10, 111 if present, 261 if present, 61 if present, 211 if present) and containing a memory film 50 therein; a set of doped semiconductor material regions (261 if present, 111 if present, 61 if present, 211 if present, 18, 90) each having a doping of a first conductivity type and collectively extending continuously from underneath the top surface of the substrate (9, 10, 111 if present, 261 if present, 61 if present, 211 if present) through the memory film 50 to a level of a topmost layer of the alternating stack (32, 46), wherein the set of doped semiconductor material regions (261 if present, 111 if present, 61 if present, 211 if present, 18, 90) includes a doped contact region (261, 111, or 211) underlying the top surface of the substrate (9, 10, 111 if present, 261 if present, 61 if present, 211 if present) and a doped semiconductor channel 90 extending through the memory opening 49; a well contact via structure 96 extending through the alternating stack (32, 46) and physically contacting a top surface of the doped contact region (261, 111, or 211); and an upper semiconductor material region 63 (e.g., drain region) contacting an upper portion of the doped semiconductor channel 90 and having a doping of a second conductivity type, wherein a p-n junction is provided between the upper semiconductor material portion 63 and the doped semiconductor channel 90.

In one embodiment, the doped contact region (261, 111, or 211) comprises a single crystalline semiconductor material. In one embodiment, a semiconductor material layer 10 can be located within the substrate (9, 10, 111 if present, 261 if present, 61 if present, 211 if present). The semiconductor material layer 10 can comprise another single crystalline semiconductor material in epitaxial alignment with the single crystalline semiconductor material of the doped contact region (261, 111, or 211). In one embodiment, the single crystalline semiconductor material of the doped contact region (261, 111, or 211) can be the same semiconductor material as the semiconductor material of an underlying semiconductor material portion (such as the doped semiconductor well 111 or the semiconductor material layer 10), and can have a higher concentration of dopants of the first conductivity type than the underlying semiconductor material portion.

In one embodiment, the set of doped semiconductor material regions (261 if present, 111 if present, 61 if present, 211 if present, 18, 90) comprises an epitaxial pedestal 11 including a single crystalline semiconductor material and located within a lower portion of the memory opening 49, wherein the doped semiconductor channel 90 overlies the epitaxial pedestal 11. In one embodiment, the set of doped semiconductor material regions (261 if present, 111 if present, 61 if present, 211 if present, 18, 90) comprises a lower doped semiconductor portion 17 contacting a top surface of the epitaxial pedestal 11 and a bottom surface of the doped semiconductor channel 90. In one embodiment, the lower doped semiconductor portion 17 has a greater concentration of dopants of the first conductivity type than the epitaxial pedestal 11 and the doped semiconductor channel 90. The doped semiconductor channel 90 can have a dopant concentration in a range from $1.0 \times 10^{15}/cm^3$ to $1.0 \times 10^{18}/cm^3$, such as from $1.0 \times 10^{15}/cm^3$ to $1.0 \times 10^{17}/cm^3$ after an anneal process that homogenizes the dopant concentration within the doped semiconductor channel 90, and converts any amorphous semiconductor material therein into a polycrystalline semiconductor material. In one embodiment, the lower doped semiconductor portion 17 comprises a single crystalline semiconductor material in epitaxial alignment with the epitaxial pedestal 11. In one embodiment, the doped semiconductor channel 90 can protrude into a recessed portion of the lower doped semiconductor portion 17. In this case, a sidewall of the doped semiconductor channel 90 contacts a sidewall of the lower doped semiconductor material portion 17.

In one embodiment, the doped contact region can be embodied as a elongated heavily doped semiconductor region 211, and can contact a bottom surface of the epitaxial pedestal 11. In one embodiment, the set of doped semiconductor regions (261 if present, 111 if present, 61 if present, 211 if present, 18, 90) comprises a doped semiconductor well 111 laterally surrounding the doped contact region (as embodied as a heavily doped contact region 261) and contacting a bottom surface of the epitaxial pedestal 11.

In one embodiment, a dielectric spacer 116 can laterally surround the epitaxial pedestal 11. One of the electrically conductive layers 46 can laterally surround the dielectric spacer 116. In one embodiment, the doped semiconductor channel 90 comprises a polycrystalline semiconductor material. In one embodiment, the p-n junction includes a cylindrical surface.

In one embodiment, the monolithic three-dimensional memory device can further include a trench 79 vertically extending at least from a first horizontal plane including a topmost surface of the alternating stack (32, 46) to a second horizontal plane including the top surface of the substrate (9, 10, 111 if present, 261 if present, 61 if present, 211 if present); and a trench fill dielectric material portion 174 which completely fills the trench 79 and contacts a sidewall of each of the electrically conductive layers 46.

The memory film 50 can contact a sidewall of the memory opening 49; and the memory film 50 can comprise, from outside to inside, a blocking dielectric layer (501, 503), a memory material layer 504, and a tunneling dielectric layer 506.

In one embodiment, the monolithic three-dimensional memory device comprises a vertical NAND device located over the substrate (9, 10, 111 if present, 261 if present, 61 if present, 211 if present). The electrically conductive layers 46 comprise, or are electrically connected to, a respective word line of the vertical NAND device. The substrate can comprise a silicon substrate. The vertical NAND device can comprise an array of monolithic three-dimensional NAND strings located over the silicon substrate. At least one memory cell in a first device level of the three-dimensional array of NAND strings is located over another memory cell in a second device level of the three-dimensional array of NAND strings. The silicon substrate can contain an integrated circuit comprising a driver circuit for the memory device located thereon.

In one embodiment, the array of monolithic three-dimensional NAND strings can comprise a plurality of semiconductor channels (90), wherein at least one end portion of each of the plurality of semiconductor channels extends substantially perpendicular to a top surface of the substrate. The array of monolithic three-dimensional NAND strings can comprise a plurality of charge storage elements. Each charge storage element can be located adjacent to a respective one of the plurality of semiconductor channels. The array of monolithic three-dimensional NAND strings can comprise a plurality of control gate electrodes (as embodied as a subset of electrically conductive layers 46) having a strip shape extending substantially parallel to the top surface of the substrate. The plurality of control gate electrodes can comprise at least a first control gate electrode located in the first device level and a second control gate electrode located in the second device level.

In one embodiment, the monolithic three-dimensional memory device as embodied in the second exemplary structure of the present disclosure can be programmed to store data by storing electrical charge in memory elements within the memory stack structure 55. The data can be read by measuring majority charge carrier current passing through the doped semiconductor channel 90. In case the first conductivity type is p-type, the majority charge carrier current can be a hole current. In this case, a hole current (i.e., flow of holes) flowing from the lower doped semiconductor portion 17 through the doped semiconductor channel 90 to the upper doped semiconductor portion 63 is measured during the read operation. The charge carriers of the first conductivity type (e.g. holes) can be supplied from the doped well region 111 or the heavily doped contact region 261, if present, and flow from the doped well region 111 or the heavily doped contact region 261 to the epitaxial pedestal 11, and then to the lower doped semiconductor portion 17, and then to the doped semiconductor channel 90, and into the upper doped semiconductor portion 63. The doped well region 111 and/or the heavily doped contact region 261, the epitaxial pedestal 11, and the lower doped semiconductor portion 17 can have a doping of the first conductivity type such that the dopant concentration in the epitaxial pedestal 11 is lower than the dopant concentration in the doped well region 111 or the heavily doped contact region 261, and/or is lower than the dopant concentration in the lower doped semiconductor region 17.

The lower doped semiconductor portion 17 can have a greater dopant concentration than the epitaxial pedestal 11 to provide Ohmic contact between the doped semiconductor channel 90 and the epitaxial pedestal 11. The lower doped semiconductor portion 17 can be conductive, i.e., can be degenerately doped to have electrical conductivity greater than $1.0 \times 10^5$ S/cm. The epitaxial pedestal 11 can have a lesser dopant concentration than the lower doped semiconductor portion 17 and the doped semiconductor well 111 so that the epitaxial pedestal is semiconducting, i.e., have electrical conductivity in a range between $1.0 \times 10^{-6}$ S/cm to $1.0 \times 10^5$ S/cm, and the current flow through the epitaxial pedestal is controlled by the at least one electrically conductive layer 46A laterally surrounding the dielectric spacer 116 (unless the select gate electrode 46 is omitted). The doped semiconductor well 111 can have a greater dopant concentration than the epitaxial pedestal 11 to provide low electrical resistance. Because the doped semiconductor well 111 functions as a source line that provides electrical charge carriers of the first conductivity type for conduction of electrical current through the p-n junction structure (90, 63), low resistance of the doped semiconductor well 111 can increase the on-current through the p-n junction structure (90, 63).

The operation of the device of the second exemplary structure can be the same as the operation of the device of the first exemplary structure. For example, an exemplary bias setting for hole current detection illustrated in FIG. 13A can be employed.

The device of the second embodiment of the present disclosure employs the majority charge carriers of the doped well region 111, the epitaxial pedestal 11, and the lower doped semiconductor portion 17 as the charge carriers employed to conductive the predominant portion of electrical current through the doped semiconductor channel 90 during the read operation. As such, there is no need to provide a doped region of a second conductivity type (such as a n-type source region in prior art structures) near each set of the memory stack structure 55. Therefore, a large metal contact via structure filling a contact via cavity located in the trench 79 is not necessary, and the contact via cavity in the trench 79 can be filled with a dielectric fill material portion 174. The trenches 79 containing the dielectric fill material portion 174 may be narrower than prior art trenches 79 since there is no source electrode/contact via structure located therein. This increases the active device area, decreases the manufacturing cost per string and avoid possible short circuits between the control gates 46 and the source electrode. Further, since a large metal contact via structure (e.g., tungsten structure) is not needed in proximity to each set of the memory stack structures 55 surrounded by the control gate "fingers", mechanical stress from a large metal contact via structure can be avoided in the second exemplary structure of the present disclosure. The decrease in stress decreases undesirable substrate warpage. Thus, the present disclosure provides a three-dimensional memory structure that has less mechanical stress than prior art structures employing a p-n-p transistor structure or an n-p-n transistor structure and uses one common well contact via structure 96 for plural sets of memory structures 55.

By increasing the concentration of first conductivity type dopants in the doped semiconductor channel 90 in the second exemplary structure relative to the intrinsic semiconductor channel 60 in the first exemplary structure, the energy barrier between the epitaxial semiconductor portion 18 and the doped semiconductor channel 90 can be lowered in the second exemplary structure relative to the first exemplary structure. Thus, the second exemplary structure can provide enhancement of the on-current through the doped semiconductor channel 90.

Referring collectively to all embodiments of the present disclosure, each of the first and second exemplary structures can include a monolithic three-dimensional memory device comprising: an alternating stack (32, 46) of insulating layers 32 and electrically conductive layers 46 located over a semiconductor substrate (9, 10, 111 if present, 261 if present, 61 if present, 211 if present); a memory opening 49 extending through the alternating stack (32, 46) and at least to a top surface of the semiconductor substrate (9, 10, 111 if present, 261 if present, 61 if present, 211 if present) and containing a memory film 50 and a semiconductor channel (60 or 90) therein; a set of doped semiconductor material regions (261 if present, 111 if present, 61 if present, 211 if present, 18) each having a doping of a first conductivity type and collectively extending continuously from underneath the top surface of the semiconductor substrate (9, 10, 111 if present, 261 if present, 61 if present, 211 if present) through the memory film 50 to a level of a bottommost layer of the alternating stack (32, 46), wherein the set of doped semiconductor material regions (261 if present, 111 if present, 61 if present, 211 if present, 18) includes a doped contact region (261, 111, or 211) underlying the top surface of the semiconductor substrate (9, 10, 111 if present, 261 if present, 61 if present, 211 if present) and an epitaxial pedestal 11 located at a bottom portion of the memory opening 49; a well contact via structure 96 extending through the alternating stack (32, 46) and physically contacting a top surface of the doped contact region (261, 111, or 211); and an upper semiconductor material region 63 contacting an upper portion of the semiconductor channel (60 or 90) and having a doping of a second conductivity type, wherein one of the first and second conductivity types is p-type and another of the first and second conductivity types is n-type.

In one embodiment, the semiconductor channel (60 or 90) can comprise a first polycrystalline semiconductor material, and the upper doped semiconductor portion 63 can comprise a second polycrystalline semiconductor material. In one embodiment, the lower doped semiconductor portion 17 can comprise a single crystalline semiconductor material. In one embodiment, the lower doped semiconductor portion 17 can be in epitaxial alignment with a single crystalline lattice structure of a semiconductor material in the substrate (9, 10, 111 if present, 261 if present, 61 if present, 211 if present). For example, the lower doped semiconductor portion 17 can be in epitaxial alignment with the single crystalline lattice structure of the doped semiconductor well 111 in the substrate.

An epitaxial material portion, as embodied as an epitaxial pedestal 11, can underlie the lower doped semiconductor portion 17. The epitaxial pedestal 11 can have a doping of the first conductivity type at a lower dopant concentration than the lower doped semiconductor portion 17. The epitaxial pedestal 11 can be in epitaxial alignment with the single crystalline lattice structure of a semiconductor material in the substrate (9, 10, 111 if present, 261 if present, 61 if present, 211 if present) such as the doped semiconductor well 111.

In one embodiment, the substrate (9, 10, 111, 261 if present, 61 if present, 211 if present) can comprise a doped semiconductor well 111 contacting the epitaxial material portion (as embodied as the epitaxial pedestal 11) having a doping of the first conductivity type. In one embodiment, the doped semiconductor well 111 has a doping of the first conductivity type at a higher dopant concentration than the dopant concentration in the epitaxial pedestal 11. The substrate (9, 10, 111 if present, 261 if present, 61 if present, 211 if present) can further comprise a first conductivity type doped semiconductor region (as embodied as the semiconductor material layer 10) located underneath a top surface 7A of the substrate (9, 10, 111 if present, 261 if present, 61 if present, 211 if present), contacting the doped semiconductor well 111, and vertically spaced from the epitaxial pedestal 11 by a region of the doped semiconductor well 111.

In one embodiment, a dielectric spacer 116 can laterally surround the epitaxial pedestal 11. At least one of the electrically conductive layers 46 can laterally surround the dielectric spacer 116.

In one embodiment, a trench vertically extends from a first horizontal plane including a topmost surface of the stack of alternating layers (32, 46) to a second horizontal plane including a bottommost surface of the stack of alternating layers (32, 46). A trench fill dielectric material portion 174 is located in the trench, preferably completely fills the trench, and contacts a sidewall of each of the electrically conductive layers 46.

In one embodiment, the memory stack structure 55 can be located within a memory opening extending through the stack of alternating layers and comprises a memory film 50 that contacts a sidewall of the memory opening. In one embodiment, the memory film 50 comprises, from outside to inside, a blocking dielectric layer (501, 503), a memory material layer 504, and a tunneling dielectric layer 506.

The first and second exemplary structures of the present disclosure can provide low manufacturing cost through reduction of footprint for a three-dimensional memory device, and through reduction of the number of processing steps. Specifically, narrower backside trenches 79 can be employed relative to conventional structures because the backside trenches 79 do not require an insulating spacer of a metal fill. Further, filing the backside trenches 79 with a dielectric material requires a lesser number of processing steps than filling the backside trenches 79 with a combination of an insulating spacer and a metal fill structure.

Further, by eliminating a metal fill structure within the backside trenches, the first and second exemplary structures of the present disclosure provides higher tolerance against wafer warpage. Thus, compared to conventional structures in which tungsten is employed to fill the backside trenches, the first and second exemplary structures of the present disclosure provide greater structural stability and reliability.

In addition, the first and second exemplary structures of the present disclosure are more conductive to device scaling than conventional structures requiring a metal fill in backside trenches because the lateral dimensions of the backside trenches can be reduced in the first and second exemplary structures of the present disclosure relative to conventional structures.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device comprising:
    a stack of alternating layers comprising insulating layers and electrically conductive layers and located over a substrate;
    a memory stack structure located within a memory opening that extends through the stack and comprises a memory film and a semiconductor junction structure vertically extending through the stack substantially perpendicular to a top surface of the substrate, wherein the semiconductor junction structure comprises a semiconductor channel portion extending through a plurality of electrically conductive layers within the stack of alternating layers, a lower doped semiconductor source portion underlying the semiconductor channel portion and having a doping of a first conductivity type, and an upper doped semiconductor drain portion having a doping of a second conductivity type such that a junction is located between the semiconductor channel portion and an upper doped semiconductor drain portion;
    a semiconductor material portion located within the memory opening, underlying the lower doped semiconductor source portion, having a doping of the first conductivity type, and having a lower dopant concentration than the lower doped semiconductor source portion; and
    a dielectric spacer laterally surrounding the semiconductor material portion, wherein the dielectric spacer is laterally surrounded by one of the electrically conductive layers, and the one of the electrically conductive layers is configured to control current flow through the semiconductor material portion along a vertical direction,
    wherein one of the first and second conductivity types is p-type and another of the first and second conductivity types is n-type.

2. The monolithic three-dimensional memory device of claim 1, wherein:
    the first conductivity type is p-type and the second conductivity type is n-type;
    the semiconductor channel portion comprises a first polycrystalline semiconductor material containing electrical dopants of the first conductivity type;
    the upper doped semiconductor drain portion comprises a second polycrystalline semiconductor material;
    the lower doped semiconductor source portion comprises a single crystalline semiconductor material; and
    the lower doped semiconductor source portion is in epitaxial alignment with a single crystalline lattice structure of a semiconductor material in the substrate.

3. The monolithic three-dimensional memory device of claim 2, wherein the semiconductor material portion is an epitaxial material portion.

4. The monolithic three-dimensional memory device of claim 3, wherein:
    the epitaxial material portion is in epitaxial alignment with a single crystalline lattice structure of a semiconductor material in the substrate; and
    the substrate comprises a doped semiconductor well contacting the epitaxial material portion and having a doping of the first conductivity type at a higher dopant concentration than a dopant concentration in the epitaxial material portion; and
    the substrate comprises a first conductivity type doped semiconductor region located underneath a top surface of the substrate, contacting the doped semiconductor well, and vertically spaced from the epitaxial material portion by a region of the doped semiconductor well.

5. The monolithic three-dimensional memory device of claim 1, further comprising:
    a trench vertically extending from a first horizontal plane including a topmost surface of the stack of alternating layers to a second horizontal plane including a bottommost surface of the stack of alternating layers; and
    a trench fill dielectric material portion which completely fills the trench and contacts a sidewall of each of the electrically conductive layers.

6. The monolithic three-dimensional memory device of claim 1, wherein:
    the memory stack structure is located within a memory opening extending through the stack of alternating layers;
    the memory film contacts a sidewall of the memory opening; and
    the memory film comprises, from outside to inside, a blocking dielectric layer, a memory material layer, and a tunneling dielectric layer.

7. The monolithic three-dimensional memory device of claim 1, wherein:
    the monolithic three-dimensional memory device comprises a vertical NAND device located over the substrate;
    the electrically conductive layers comprise, or are electrically connected to, a respective word line of the vertical NAND device;
    the substrate comprises a silicon substrate;
    the vertical NAND device comprises an array of monolithic three-dimensional NAND strings located over the silicon substrate;

at least one memory cell in a first device level of the three-dimensional array of NAND strings is located over another memory cell in a second device level of the three-dimensional array of NAND strings;

the silicon substrate contains an integrated circuit comprising a driver circuit for the memory device located thereon; and the array of monolithic three-dimensional NAND strings comprises:

a plurality of semiconductor channels, wherein at least one end portion of each of the plurality of semiconductor channels extends substantially perpendicular to a top surface of the substrate;

a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

8. A monolithic three-dimensional memory device comprising:

an alternating stack of insulating layers and electrically conductive layers located over a substrate;

a memory opening extending through the alternating stack and at least to a top surface of the substrate and containing a memory film therein;

a set of doped semiconductor material regions each having a doping of a first conductivity type and collectively extending continuously from underneath the top surface of the substrate through the memory film to a level of a topmost layer of the alternating stack, wherein the set of doped semiconductor material regions includes a doped contact region underlying the top surface of the substrate, a doped semiconductor channel extending through the memory opening and extending through a plurality of electrically conductive layers within the stack of alternating layers, a lower doped semiconductor source portion underlying the doped semiconductor channel, a semiconductor material portion located within the memory opening, underlying the lower doped semiconductor source portion, having a doping of the first conductivity type, and having a lesser dopant concentration than the lower doped semiconductor source portion:

a dielectric spacer laterally surrounding the semiconductor material portion, wherein the dielectric spacer is laterally surrounded by one of the electrically conductive layers, and the one of the electrically conductive layers is configured to control current flow through the semiconductor material portion along a vertical direction;

a well contact via structure extending through the alternating stack and physically contacting a top surface of the doped contact region; and an upper semiconductor material region contacting an upper portion of the doped semiconductor channel and having a doping of a second conductivity type, wherein a p-n junction is provided between the upper semiconductor material portion and the doped semiconductor channel.

9. The monolithic three-dimensional memory device of claim 8, wherein the doped contact region comprises a single crystalline semiconductor material.

10. The monolithic three-dimensional memory device of claim 9, further comprising a semiconductor material layer located within the substrate and comprising another single crystalline semiconductor material in epitaxial alignment with the single crystalline semiconductor material of the doped contact region.

11. The monolithic three-dimensional memory device of claim 8, wherein the semiconductor material portion comprises an epitaxial pedestal including a single crystalline semiconductor material and located within a lower portion of the memory opening, wherein the doped semiconductor channel overlies the epitaxial pedestal.

12. The monolithic three-dimensional memory device of claim 11, wherein the lower doped semiconductor source portion contacts a top surface of the epitaxial pedestal and a bottom surface of the doped semiconductor channel.

13. The monolithic three-dimensional memory device of claim 12, wherein the lower doped semiconductor source portion has a greater concentration of dopants of the first conductivity type than the doped semiconductor channel.

14. The monolithic three-dimensional memory device of claim 12, wherein the lower doped semiconductor source portion comprises another single crystalline semiconductor material in epitaxial alignment with the epitaxial pedestal.

15. The monolithic three-dimensional memory device of claim 12, wherein a sidewall of the doped semiconductor channel contacts a sidewall of the lower doped semiconductor material portion.

16. The monolithic three-dimensional memory device of claim 11, wherein the doped contact region contacts a bottom surface of the epitaxial pedestal.

17. The monolithic three-dimensional memory device of claim 11, wherein the set of doped semiconductor regions comprises a doped semiconductor well laterally surrounding the doped contact region and contacting a bottom surface of the epitaxial pedestal.

18. The monolithic three-dimensional memory device of claim 8, wherein:

the doped semiconductor channel comprises a polycrystalline semiconductor material; and the p-n junction includes a cylindrical surface.

19. The monolithic three-dimensional memory device of claim 8, further comprising:

a trench vertically extending at least from a first horizontal plane including a topmost surface of the alternating stack to a second horizontal plane including the top surface of the substrate; and a trench fill dielectric material portion which completely fills the trench and contacts a sidewall of each of the electrically conductive layers.

20. The monolithic three-dimensional memory device of claim 8, wherein:

the memory film contacts a sidewall of the memory opening; and the memory film comprises, from outside to inside, a blocking dielectric layer, a memory material layer, and a tunneling dielectric layer.

21. The monolithic three-dimensional memory device of claim 8, wherein:

the monolithic three-dimensional memory device comprises a vertical NAND device located over the substrate;

the electrically conductive layers comprise, or are electrically connected to, a respective word line of the vertical NAND device;

the substrate comprises a silicon substrate;
the vertical NAND device comprises an array of monolithic three-dimensional NAND strings located over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the array of monolithic three-dimensional NAND strings comprises:
  a plurality of semiconductor channels, wherein at least one end portion of each of the plurality of semiconductor channels extends substantially perpendicular to a top surface of the substrate;
  a plurality of charge storage elements, each charge storage element located adjacent to a respective one of the plurality of semiconductor channels; and
a plurality of control gate electrodes embodied as portions of the electrically conductive layers and having a strip shape extending substantially parallel to the top surface of the substrate, the plurality of control gate electrodes comprising at least a first control gate electrode located in the first device level and a second control gate electrode located in the second device level.

* * * * *